(12) United States Patent
Krug, Jr. et al.

(10) Patent No.: US 9,655,286 B2
(45) Date of Patent: May 16, 2017

(54) FACILITATING FLUID LEVEL SENSING

(71) Applicant: INTERNATIONAL BUSINESS MACHINES CORPORATION, Armonk, NY (US)

(72) Inventors: Francis R. Krug, Jr., Highland, NY (US); Randy J. Zoodsma, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 549 days.

(21) Appl. No.: 13/648,537

(22) Filed: Oct. 10, 2012

(65) Prior Publication Data
US 2014/0096930 A1 Apr. 10, 2014

(51) Int. Cl.
| | |
|---|---|
| *B60H 1/00* | (2006.01) |
| *G01F 23/00* | (2006.01) |
| *G01F 23/24* | (2006.01) |
| *G01F 23/26* | (2006.01) |
| *G01D 21/00* | (2006.01) |
| *H01H 35/24* | (2006.01) |

(Continued)

(52) U.S. Cl.
CPC ..... *H05K 7/20781* (2013.01); *H05K 7/20836* (2013.01); *F24F 11/001* (2013.01); *F24F 11/02* (2013.01); *G01F 23/24* (2013.01); *G01F 23/242* (2013.01); *G01F 23/248* (2013.01); *G05D 9/12* (2013.01)

(58) Field of Classification Search
CPC ......... F24F 11/001; F24F 11/02; G01F 23/24; G01F 23/242; G01F 23/248; G05D 9/12
USPC .............. 73/290 R, 304 R, 866.5; 165/11.1; 200/83 R, 190; 324/204
See application file for complete search history.

(56) References Cited

U.S. PATENT DOCUMENTS

| | | | | |
|---|---|---|---|---|
| 2,813,954 A | * | 11/1957 | Deleonardis | G01F 23/242 200/235 |
| 2,924,756 A | * | 2/1960 | Tolin | 361/178 |

(Continued)

OTHER PUBLICATIONS

Document entitled "Training Manual Capacitive and Level Sensors" by IFM Feb. 2003.*

(Continued)

*Primary Examiner* — Jianying Atkisson
*Assistant Examiner* — Paul Alvare
(74) *Attorney, Agent, or Firm* — Margaret A. McNamara, Esq.; Kevin P. Radigan, Esq.; Heslin Rothenberg Farley & Mesiti P.C.

(57) ABSTRACT

Apparatuses are provided to facilitate sensing fluid within a fluid system, such as a coolant-based cooling apparatus for removing heat generated by one or more electronic components. The apparatus includes a plug configured to couple to a wall of the fluid system at an opening in the wall and to form a fluid-tight seal about the opening. The plug includes a fluid a fluid-sensor-receiving space configured to receive a fluid sensor, and when the plug is coupled to the wall at the opening, to position the fluid sensor at the opening in a manner to facilitate sensing of fluid within the system. The fluid sensor is removable from the plug without requiring uncoupling of the plug from the wall. In one implementation, the fluid sensor is a proximity sensor, and the plug is fabricated of a non-conductive material, and the wall a conductive material.

12 Claims, 22 Drawing Sheets

(51) Int. Cl.
*H01H 35/26* (2006.01)
*H01H 35/34* (2006.01)
*G01N 27/74* (2006.01)
*H05K 7/20* (2006.01)
*F24F 11/00* (2006.01)
*F24F 11/02* (2006.01)
*G05D 9/12* (2006.01)

(56) References Cited

U.S. PATENT DOCUMENTS

| | | | | |
|---|---|---|---|---|
| 3,905,004 | A | * | 9/1975 | Szevernyi ............ G01F 23/248 337/104 |
| 4,258,444 | A | | 3/1981 | Orszullok |
| 5,613,549 | A | * | 3/1997 | Dolwani ...................... 165/11.1 |
| 5,722,290 | A | | 3/1998 | Kronberg |
| 6,067,854 | A | | 5/2000 | Yang |
| 6,320,282 | B1 | | 11/2001 | Caldwell |
| 8,082,785 | B2 | | 12/2011 | Rudd |
| 8,291,761 | B2 | * | 10/2012 | Burdi ................. F04D 15/0218 417/211.5 |
| 8,915,157 | B1 | * | 12/2014 | Kerbs ................... G01D 11/245 73/290 V |
| 2005/0126747 | A1 | * | 6/2005 | Chu ..................... H05K 7/2079 165/11.1 |
| 2007/0188163 | A1 | * | 8/2007 | Jagiella .............. H03K 17/9505 324/207.15 |
| 2008/0282898 | A1 | * | 11/2008 | Knepler ................ A47J 31/402 99/285 |

OTHER PUBLICATIONS

G.N. Miller et al., "High Temperature, High Pressure Water Level Sensor", 1980 Ultrasonics Symposium, pp. 877-881 (1980) (No further date information available. Note that the date of publication is sufficiently older than the earliest priority date of the application, that the month of publication is not an issue.).

G.N. Miller et al., "High Temperature, High Pressure Water Level Sensor", 1980 Ultrasonics Symposium, pp. 877-881 (1980).

Fluidswitch, "High Pressure Optical Liquid Level Sensor—OS-150", SMD Fluid Controls, Wallingford, CT, USA, Product Brochure, 2 pages (Oct. 2012).

* cited by examiner

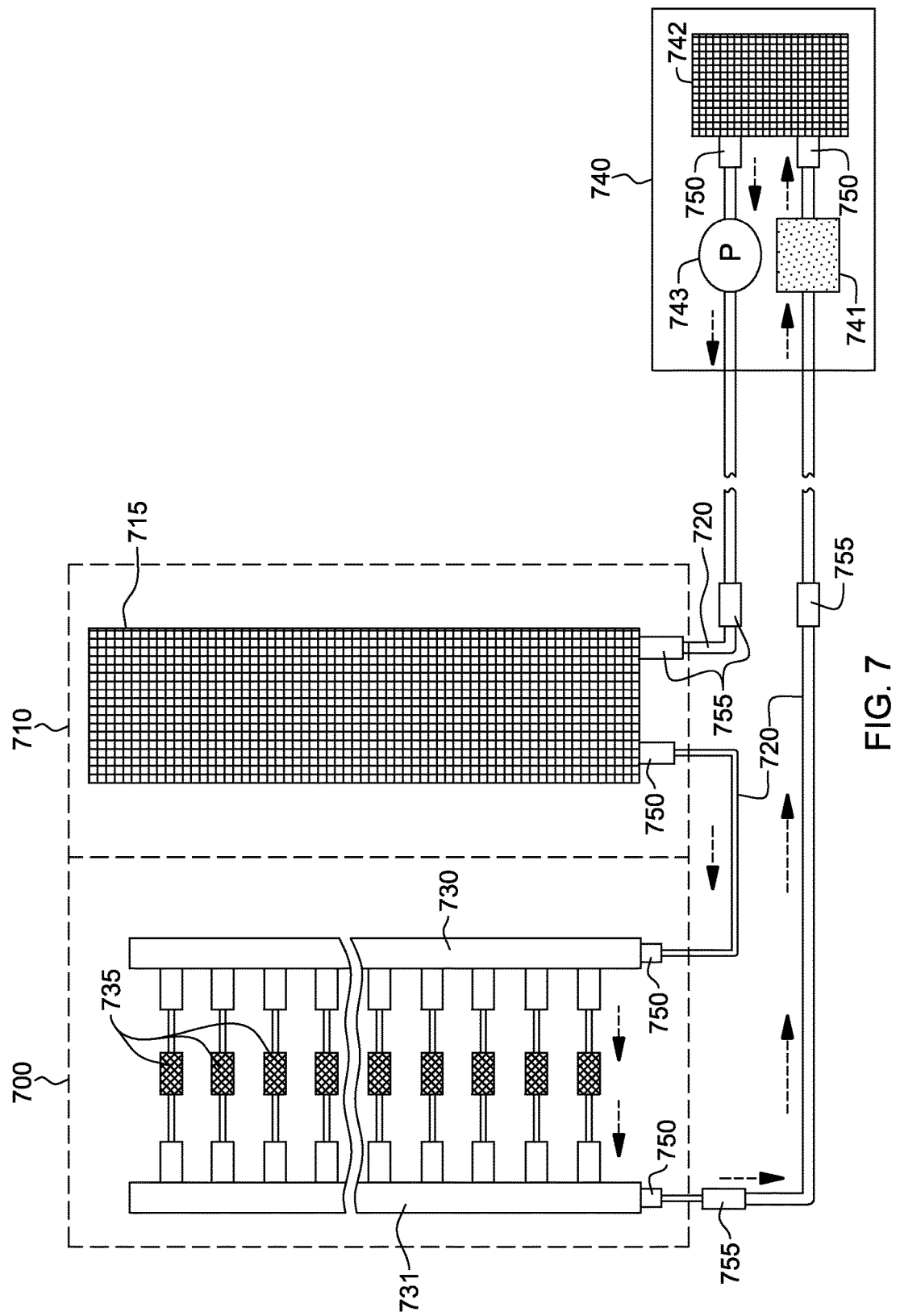

FACILITATING FLUID LEVEL SENSING

BACKGROUND

The power dissipation of integrated circuit chips, and the modules containing the chips, continues to increase in order to achieve increases in processor performance. This trend poses cooling challenges at the module, system, rack and data center levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Conventionally, the components have been cooled by air moving in parallel airflow paths, usually front-to-back, impelled by one or more air moving devices (e.g., fans or blowers). In some cases it has been possible to handle increased power dissipation within a single drawer or system by providing greater airflow, for example, through the use of more powerful air moving devices or by increasing the rotational speed (i.e., RPMs) of existing air moving devices. However, this approach is becoming problematic, particularly in the context of a computer center installation (i.e., data center).

The sensible heat load carried by the air exiting the rack(s) is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid coolant to a heat sink, whether air or other liquid. In a liquid-cooling approach, monitoring coolant level at one or more locations within the coolant loop may be desirable. However, this monitoring can be problematic if the liquid-cooled system is to undergo pressurized testing.

BRIEF SUMMARY

The shortcomings of the prior art are overcome and additional advantages are provided through the provision, in one aspect, of an apparatus comprising a plug configured to couple to a wall of a fluid system at an opening in the wall and to form a fluid-tight seal with the wall about the opening. The plug includes a fluid-sensor-receiving space configured to at least partially receive therein a fluid sensor and, when the plug is coupled to the wall at the opening, to position the fluid sensor at the opening in a manner to facilitate sensing of fluid within the fluid system, the fluid sensor being removable from the fluid-sensor-receiving space of the plug without requiring uncoupling of the plug from the wall.

In another aspect, a system is provided which includes a coolant-based cooling apparatus, configured to facilitate removal of heat generated by one or more electronic components, and including a coolant loop containing coolant of the coolant-based cooling apparatus. The system further includes a fluid sense apparatus which facilitates sensing of coolant within the coolant loop. The fluid sense apparatus includes: a plug coupled to a wall of the coolant loop at an opening in the coolant loop wall and forming a fluid-tight seal with the wall about the opening; a fluid sensor; and wherein the plug includes a fluid-sensor-receiving space configured to at least partially receive therein the fluid sensor and to position the fluid sensor at the opening in a manner to facilitate sensing of coolant within the coolant loop. The fluid sensor is removable from the fluid-sensor-receiving space of the plug without requiring an uncoupling of the plug from the wall of the coolant loop.

In a further aspect, a method is provided which includes: obtaining a coolant-based cooling apparatus to facilitate removal of heat generated by one or more electronic components, the coolant-based cooling apparatus comprising a coolant loop containing coolant of the coolant-based cooling apparatus; and providing a fluid sense apparatus facilitating sensing of coolant within the coolant loop. The fluid sense apparatus includes: a plug coupled to a wall of the coolant loop at an opening in the coolant loop wall and forming a fluid-tight seal with the wall about the opening; and wherein the plug includes a fluid-sensor-receiving space configured to at least partially receive therein a fluid sensor and to position the fluid sensor at the opening in a manner to facilitate sensing of coolant within the coolant loop. The fluid sensor is removable from the fluid-sensor-receiving space of the plug without requiring an uncoupling of the plug from the wall of the coolant loop.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7 is a schematic diagram of an alternate embodiment of a cooling system and coolant-cooled electronic system, which may employ modular pumping units (MPUs), in accordance with one or more aspects of the present invention;

DETAILED DESCRIPTION

Figure 1:
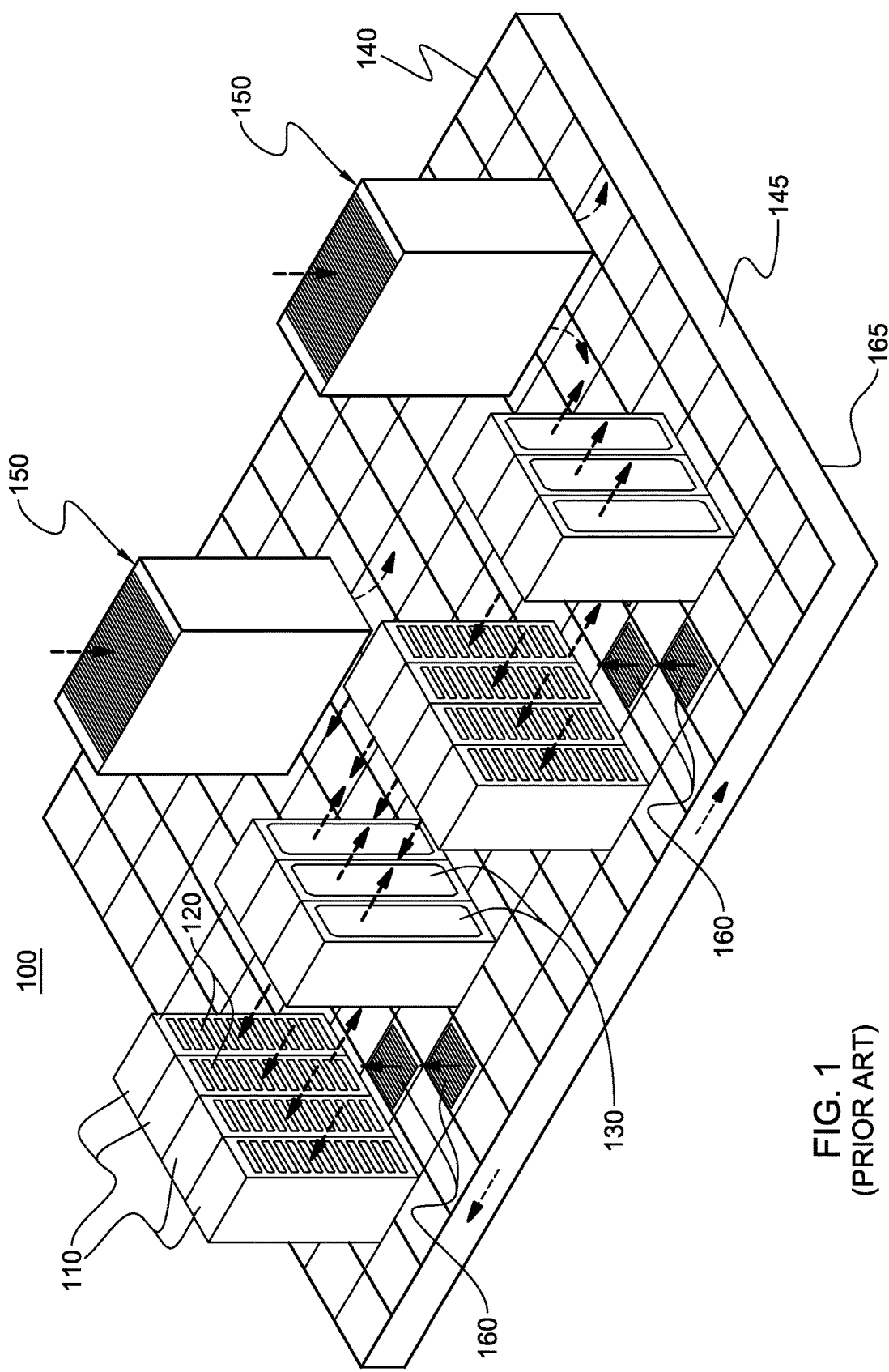
FIG. 1 depicts one embodiment of a conventional raised floor layout of an air-cooled data center.

As used herein, the terms "electronics rack", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, drawers, nodes, compartments, boards, etc., having one or more heat-generating electronic components disposed therein or thereon. An electronic system may be movable or fixed, for example, relative to an electronics rack, with rack-mounted electronic drawers of a rack unit and blades of a blade center system being two examples of electronic systems (or subsystems) of an electronics rack to be cooled. In one embodiment, an electronic system may comprise multiple different types of electronic components, and may be, in one example, a server unit.

"Electronic component" refers to any heat generating electronic component of, for example, an electronic system requiring cooling. By way of example, an electronic component may comprise one or more integrated circuit dies and/or other electronic devices to be cooled, including one or more processor dies, memory dies or memory support dies. As a further example, an electronic component may comprise one or more bare dies or one or more packaged dies disposed on a common carrier. Further, unless otherwise specified herein, the terms "liquid-cooled cold plate" or "liquid-cooled structure" refer to any conventional thermally conductive, heat transfer structure having a plurality of channels or passageways formed therein for flowing of liquid-coolant therethrough.

As used herein, an "air-to-liquid heat exchanger", "liquid-to-air heat exchanger", or "coolant-to-air heat exchanger" means any heat exchange mechanism characterized as described herein, across which air passes and through which liquid coolant can circulate; and includes, one or more discrete heat exchangers, coupled either in series or in parallel. An air-to-liquid heat exchanger may comprise, for example, one or more coolant flow paths, formed of thermally conductive tubing (such as copper or other tubing) thermally coupled to a plurality of fins across which air passes. Size, configuration and construction of the air-toliquid heat exchanger can vary without departing from the scope of the invention disclosed herein. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other coolant, or a refrigerant, while still maintaining the advantages and unique features of the present invention.

Reference is made below to the drawings (which are not drawn to scale for ease of understanding), wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
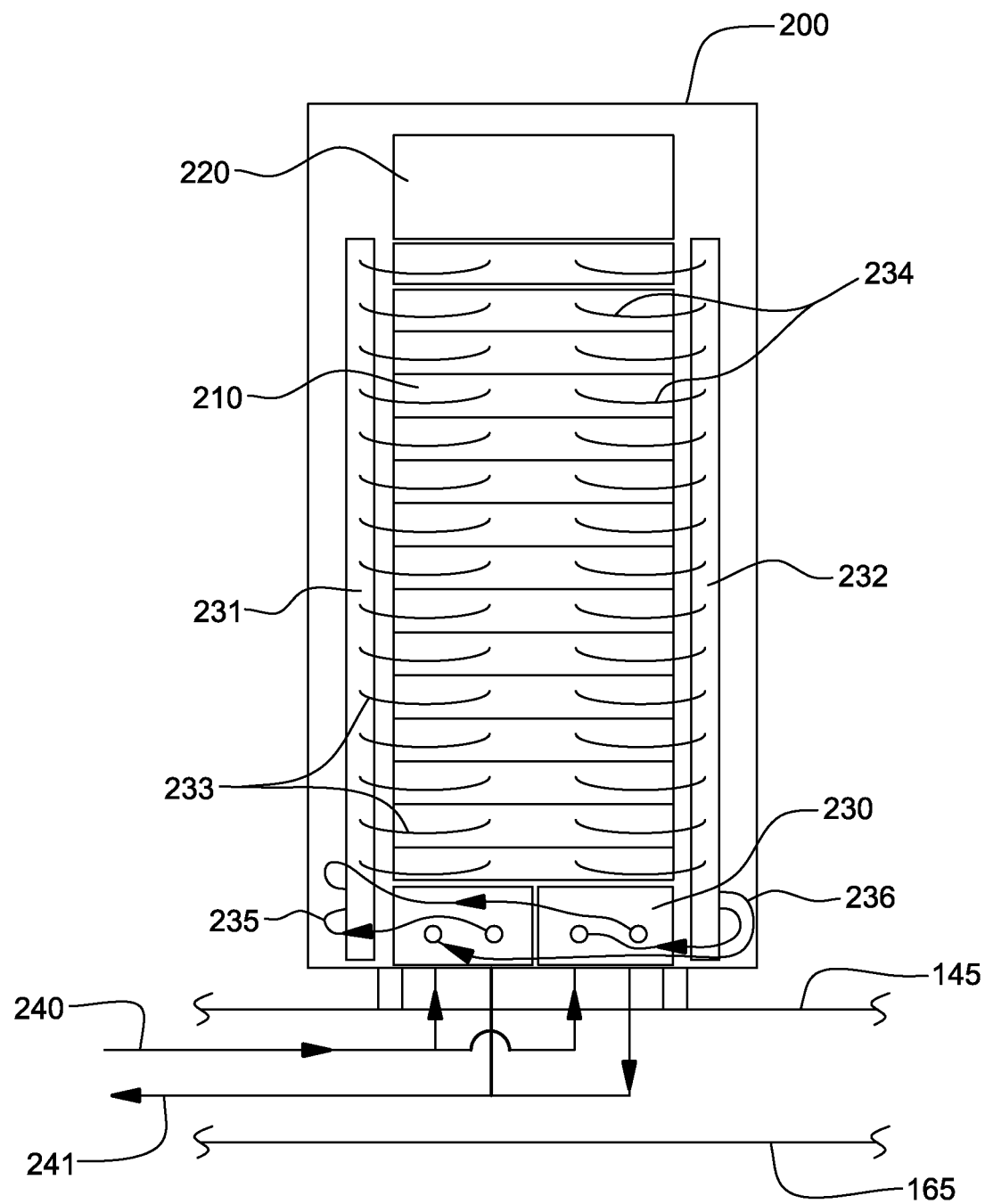
FIG. 2 is a front elevational view of one embodiment of a liquid-cooled electronics rack comprising multiple electronic systems being cooled via a cooling system, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus includes a system coolant supply manifold 231, a system coolant return manifold 232, and manifold-to-node fluid connect hoses 233 coupling system coolant supply manifold 231 to electronic systems 210 (for example, to cold plates disposed within the systems) and node-to-manifold fluid connect hoses 234 coupling the individual electronic subsystems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
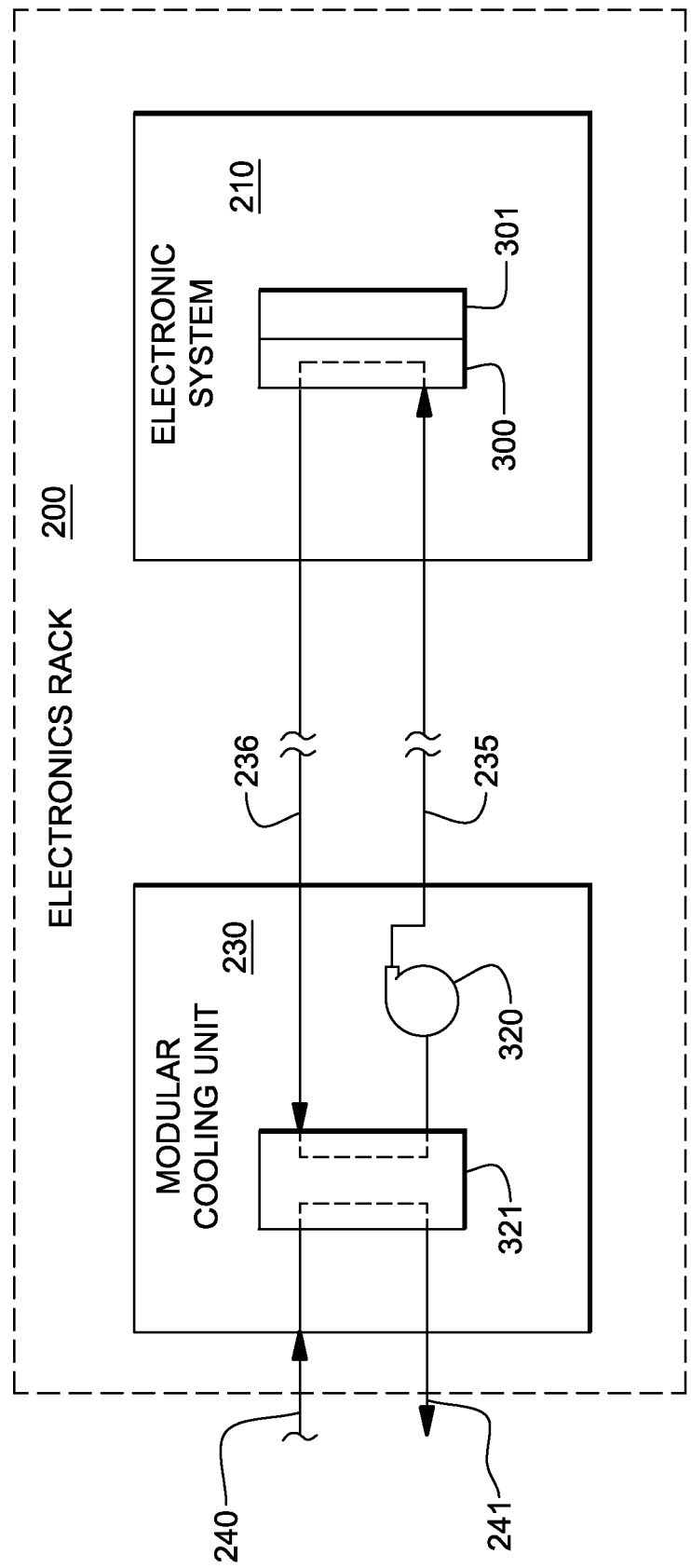
FIG. 3 is a schematic of an electronic system of an electronics rack and one approach to liquid-cooling of one or more electronic components within the electronic system, wherein the electronic component(s) is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic subsystems. Furthermore, the system coolant is physically separate from the less controlled facility coolant in lines 240, 241, to which heat is ultimately transferred in this example.

Figure 4:
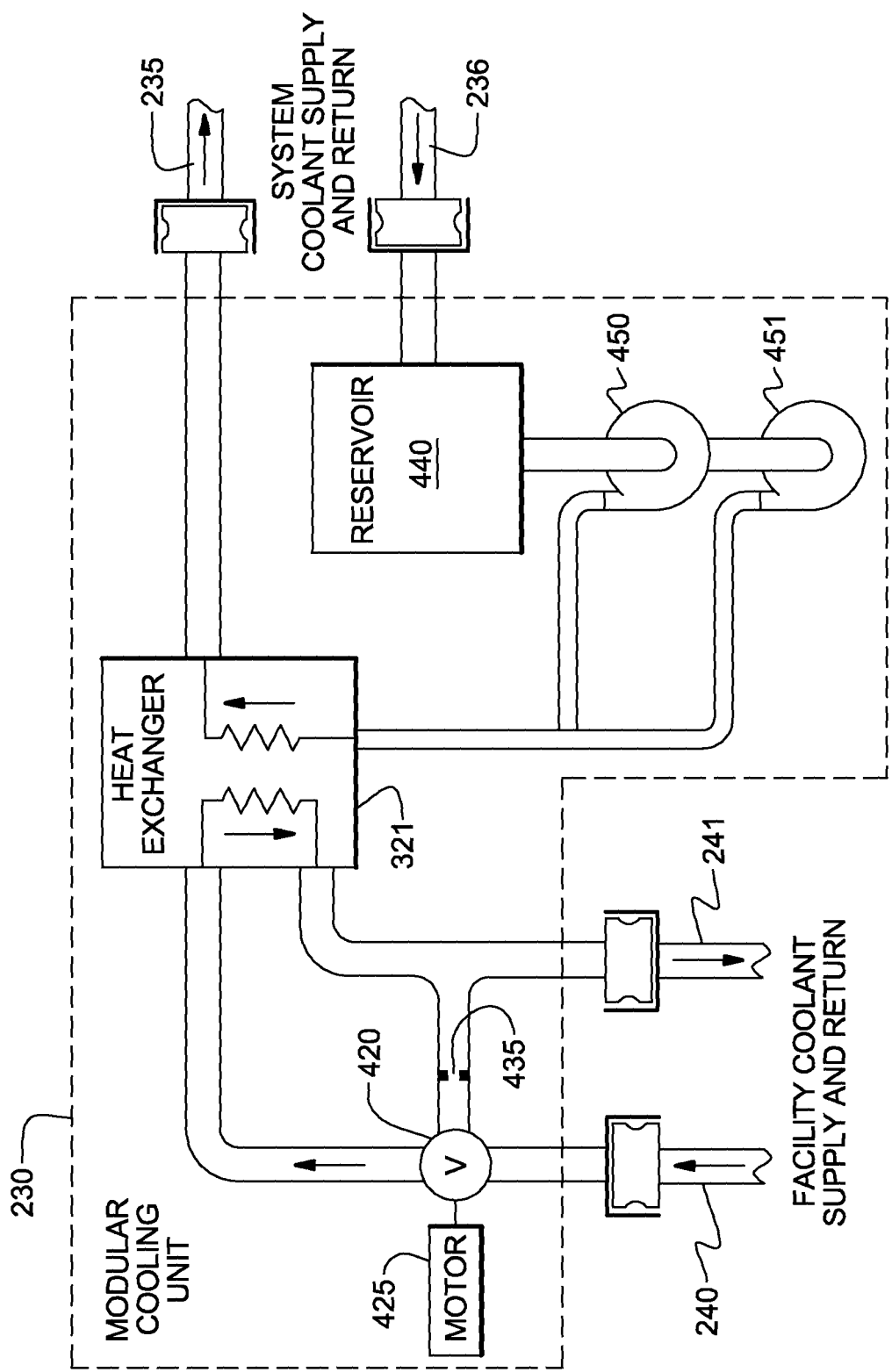
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
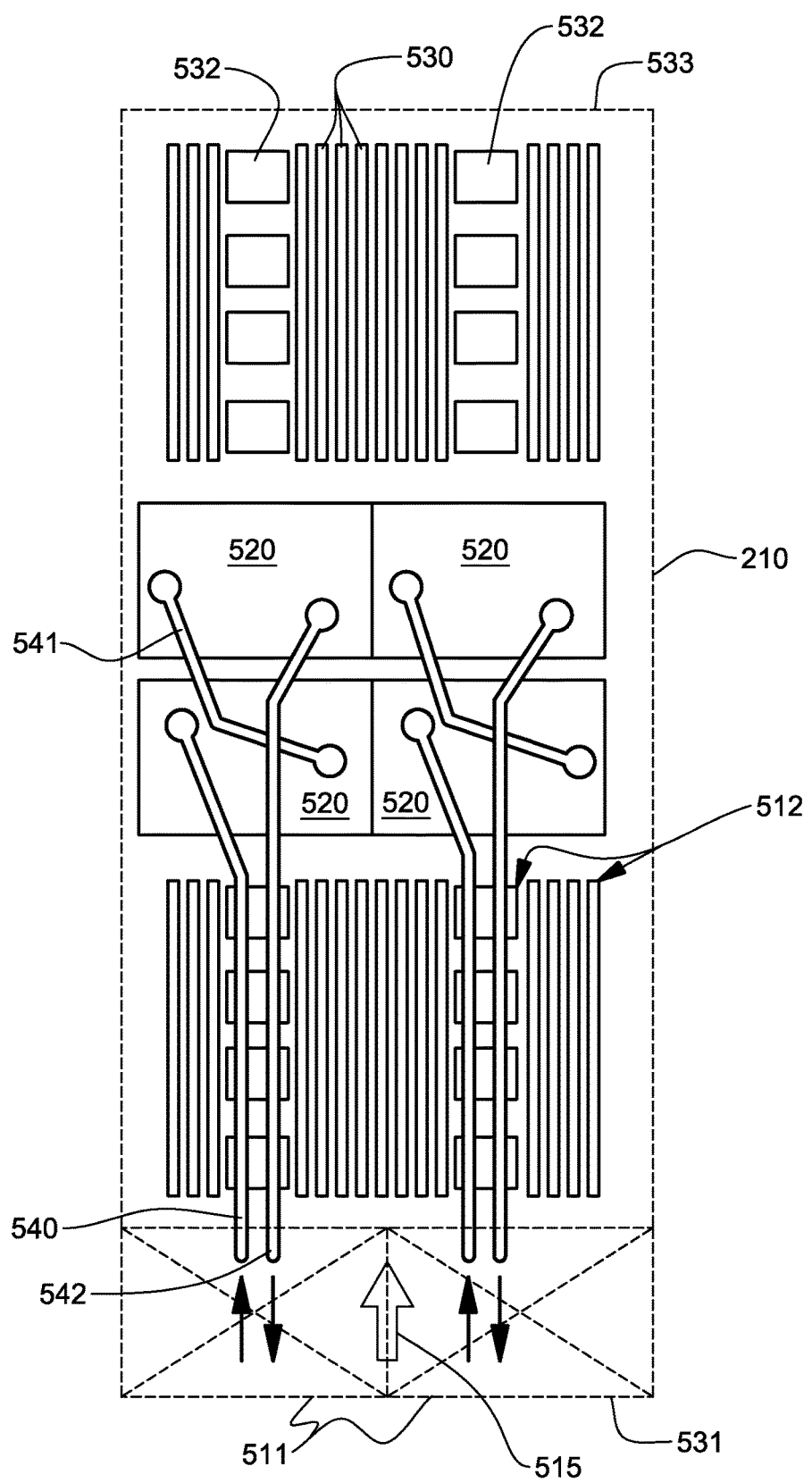
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics subsystem.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6A:
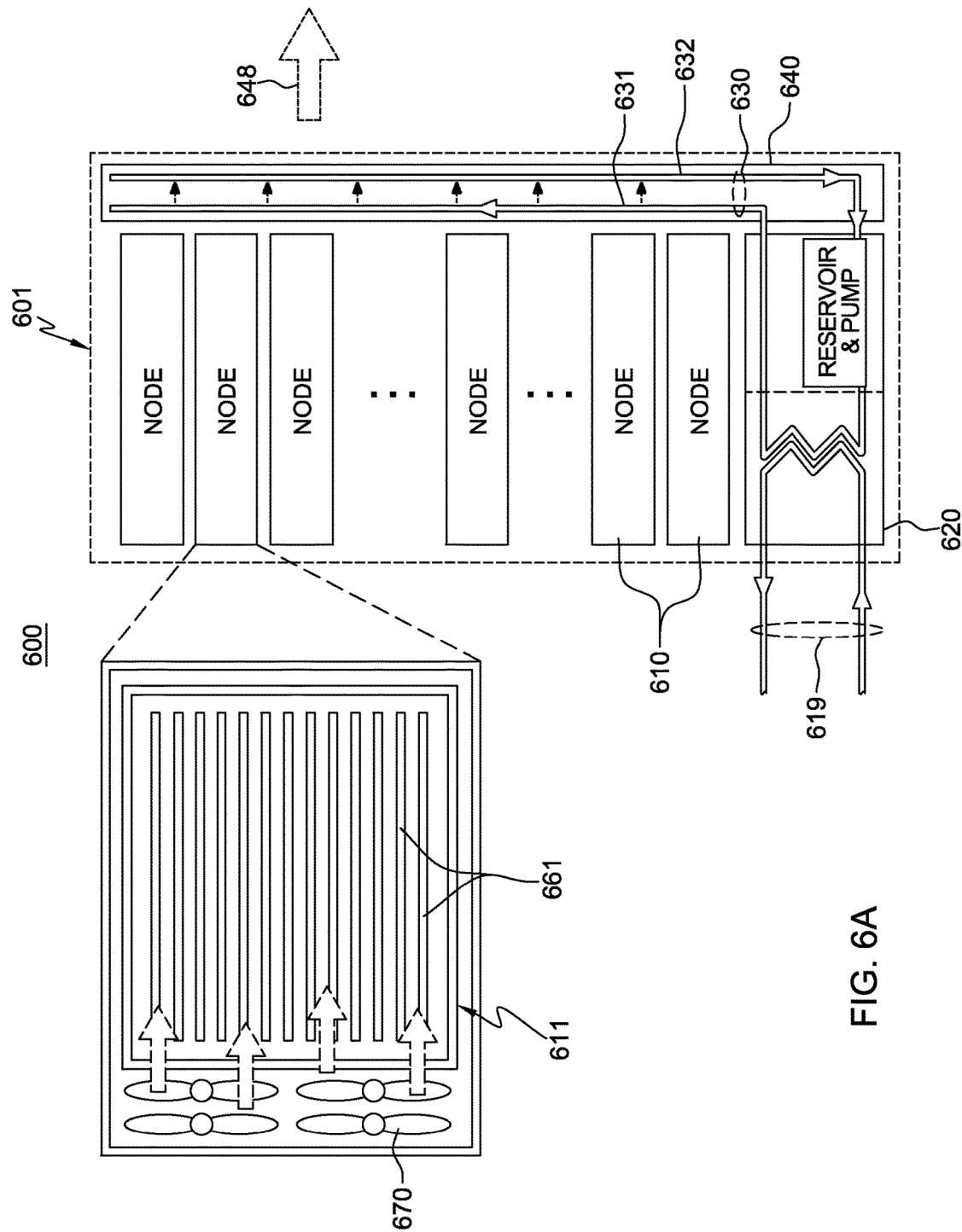
FIG. 6A is a schematic of one embodiment of a partially air-cooled electronics rack with liquid-cooling of one or more liquid-to-air heat exchangers, in accordance with one or more aspects of the present invention.

FIG. 6A is a schematic of another embodiment of an electronic system 600 comprising a liquid-cooled electronics rack 601 with a plurality of air-cooled electronic systems 610 disposed, in the illustrated embodiment, horizontally, so as to be stacked within the rack. By way of example, each electronic system 610 may be a server unit of a rack-mounted plurality of server units. In addition, each electronic system may include multiple electronic components to be cooled, which in one embodiment, comprise multiple different types of electronic components having different heights and/or shapes within the electronic system. As illustrated, one or more electronic systems 610 comprise an air-cooled heat sink 611 with a plurality of thermally conductive fins 661 projecting from the heat sink, through which airflow through the electronics rack passes. One or more air-moving devices 670 are provided within electronic system 610 to facilitate airflow from, for example, an air inlet side to an air outlet side of the liquid-cooled electronics rack 601. As explained below, the electronics rack is liquid-cooled via the inclusion of an air-to-liquid heat exchanger at the air outlet side of the rack.

The cooling apparatus is shown to include one or more modular cooling units (MCUs) 620 disposed, by way of example, in a lower portion of electronics rack 601. Each modular cooling unit 620 may be similar to the modular cooling unit depicted in FIG. 4, and described above (or may comprise multiple modular pumping units, as described below with reference to FIGS. 9-12). The modular cooling unit 620 includes, for example, a liquid-to-liquid heat exchanger for extracting heat from coolant flowing through a system coolant loop 630 of the cooling apparatus and dissipating heat within a facility coolant loop 619, comprising a facility coolant supply line and a facility coolant return line. As one example, the facility coolant supply and return lines couple modular cooling unit 620 to a data center facility cooling supply and return (not shown). Modular cooling unit 620 further includes an appropriately-sized reservoir, pump, and optional filter, for moving liquid-coolant under pressure through system coolant loop 630. In one embodiment, system coolant loop 630 includes a coolant supply manifold 631 and a coolant return manifold 632, which facilitate flow of system coolant through, for example, an air-to-liquid heat exchanger 640 mounted to an air outlet side (or an air inlet side) of electronics rack 601. Air-to-liquid heat exchanger 640 extracts heat from airflow 648 egressing from liquid-cooled electronics rack 601. By way of example, one embodiment of an air-to-liquid heat exchanger 640 is described further below with reference to FIG. 6B.

Figure 6B:
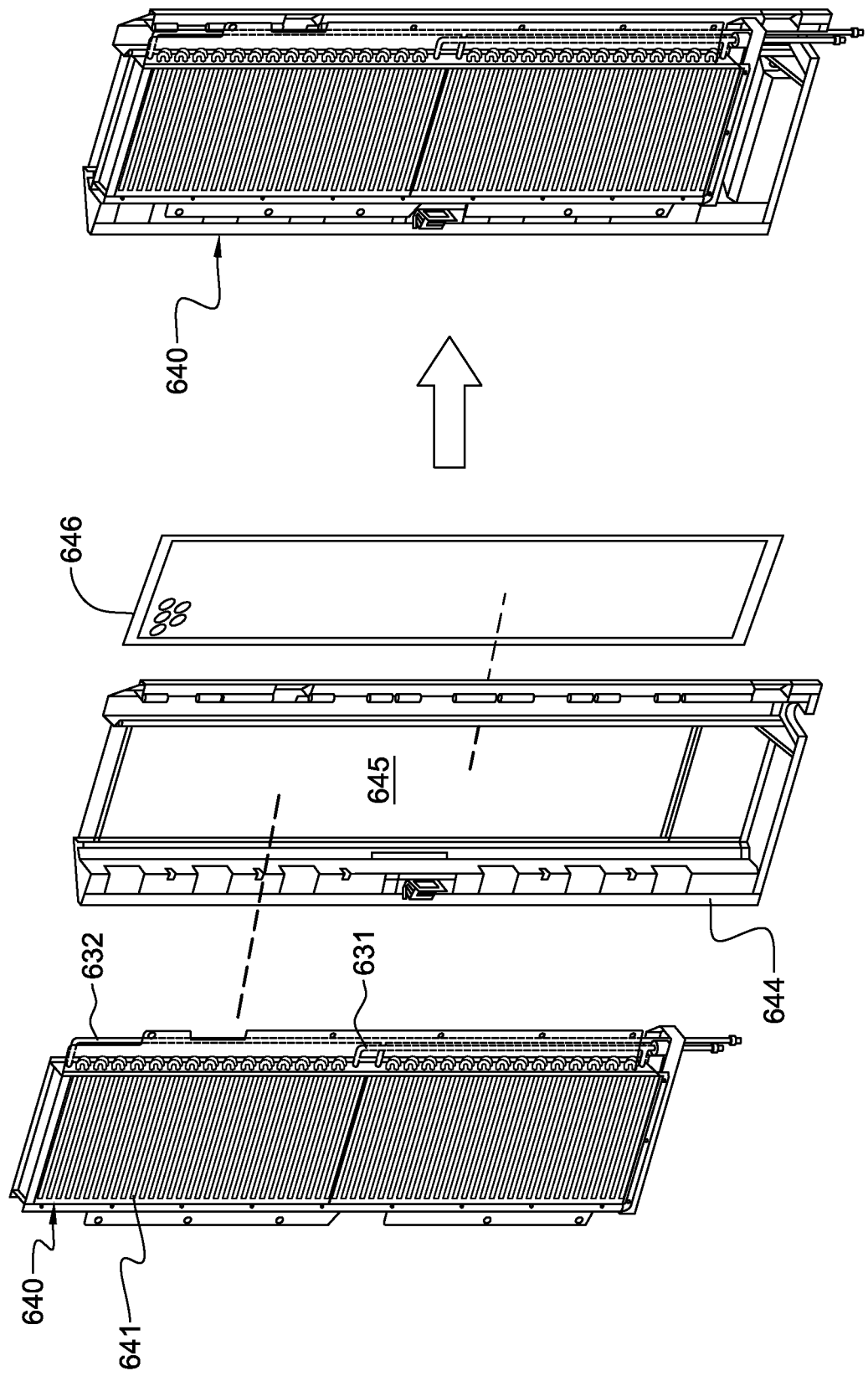
FIG. 6B is a partially exploded view of one embodiment of a liquid-to-air heat exchanger mounted in a rack door, which includes a heat exchanger coil and inlet and outlet plenums of a heat exchange system for use with an electronics rack such as depicted in FIG. 6A, in accordance with one or more aspects of the present invention.

FIG. 6B depicts additional details of one embodiment of an air-to-liquid heat exchanger mounted in a rack door. As shown at the left portion of the figure, heat exchanger 640 includes one or more tube sections 641, which in one embodiment, may have a plurality of fins projecting therefrom. Depending upon the implementation, tube sections 641 may comprise a single, serpentine channel, or a plurality of discrete heat exchange tube sections coupled together via inlet and outlet plenums 631, 632 disposed at the edge of the rack door configured to hingedly mount to the electronics rack. As shown, the one or more heat exchange tube sections are sized to substantially cover the entire opening 645 in the frame 644 of the door.

In the depicted embodiment, the heat exchange tube sections are fed coolant by coolant inlet plenum 631 and exhaust coolant via coolant outlet plenum 632. Flexible hoses (not shown) may be employed for connecting to hard plumbing disposed near the electronics rack. These hoses would be brought into air-to-liquid heat exchanger 640 adjacent to the hinge axis of the door.

FIG. 6B also illustrates one embodiment of an optional perforated planar surface 646 is illustrated. First and second such perforated planar surfaces 646 could be provided for covering first and second main sides of the heat exchanger. In one embodiment, the perforated planar surfaces comprise metal plates having appropriate air flow openings to allow inlet-to-outlet airflow through the electronics rack to readily pass through the heat exchanger. One embodiment of airflow openings in the perforated planar surfaces is depicted in FIG. 6B. In this embodiment, the perforated planar surface has a plurality of openings disposed throughout the plate. As one example, these openings may comprise hexagon-shaped openings which maximize air flow through the perforated surfaces, while still providing the desired isolation of the heat exchanger.

Each heat exchange tube section may comprise at least one of a continuous tube or multiple tubes connected together to form one continuous serpentine cooling channel. In the embodiment shown, each heat exchange tube section is a continuous tube having a first diameter, and each plenum 631, 632, is a tube having a second diameter, wherein the second diameter is greater than the first diameter. The first and second diameters are chosen to ensure adequate supply of coolant flow through the multiple tube sections. In one embodiment, each heat exchange tube section may align to a respective electronics subsystem of the electronics rack.

Although not shown in FIG. 6B, the heat exchange tube sections further include a plurality of fins extending from tube(s) 641 to facilitate heat transfer, for example, from air exhausted out the back of the electronics rack to coolant flowing through the serpentine cooling channels of the individual heat exchange tube sections. In one embodiment, the plurality of fins comprise aluminum fins extending from the individual tubes, which could be constructed of copper tubing. Further, in one implementation, the fins are brazed to the tubing.

FIG. 7 illustrates another embodiment of a coolant-cooled electronics rack and cooling system therefore, in accordance with one or more aspects of the present invention. In this embodiment, the electronics rack 700 has a side car structure 710 associated therewith or attached thereto, which includes an air-to-coolant heat exchanger 715 through which air circulates from an air outlet side of electronics rack 700 towards an air inlet side of electronics rack 700. In this example, the cooling system comprises an economizer-based, warm-liquid coolant loop 720, which comprises multiple coolant tubes (or lines) connecting, in the example depicted, air-to-coolant heat exchanger 715 in series fluid communication with a coolant supply manifold 730 associated with electronics rack 700, and connecting in series fluid communication, a coolant return manifold 731 associwith electronics rack 700, a cooling unit 740 of the cooling system, and air-to-coolant heat exchanger 715.

As illustrated, coolant flowing through warm-liquid coolant loop 720, after circulating through air-to-coolant heat exchanger 715, flows via coolant supply plenum 730 to one or more electronic systems of electronics rack 700, and in particular, one or more cold plates and/or cold rails 735 associated with the electronic systems, before returning via coolant return manifold 731 to warm-liquid coolant loop 720, and subsequently to a cooling unit 740 disposed (for example) outdoors from the data center. In the embodiment illustrated, cooling unit 740 includes a filter 741 for filtering the circulating coolant, a condenser (or air-to-coolant heat exchanger) 742 for removing heat from the coolant, and a pump 743 for returning the coolant through warm-liquid coolant loop 720 to air-to-coolant heat exchanger 715, and subsequently to the coolant-cooled electronics rack 700. By way of example, hose barb fittings 750 and quick disconnect couplings 755 may be employed to facilitate assembly or disassembly of warm-liquid coolant loop 720.

In one example of the warm coolant-cooling approach of FIG. 7, ambient temperature might be 30° C., and coolant temperature 35° C. leaving the air-to-coolant heat exchanger 742 of the cooling unit. The cooled electronic system depicted thus facilitates a chiller-less data center. Advantageously, such a coolant-cooling solution provides highly energy efficient cooling of the electronic system(s) of the electronics rack, using coolant (e.g., water), that is cooled via circulation through the air-to-coolant heat exchanger located outdoors (i.e., a dry cooler) with external ambient air being pumped through the dry cooler. Note that this warm coolant-cooling approach of FIG. 7 is presented by way of example only. In alternate approaches, cold coolant-cooling could be substituted for the cooling unit 740 depicted in FIG. 7. Such cold coolant-cooling might employ building chilled facility coolant to cool the coolant flowing through the coolant-cooled electronics rack, and associated air-to-coolant heat exchanger (if present), in a manner such as described above.

Figure 8:
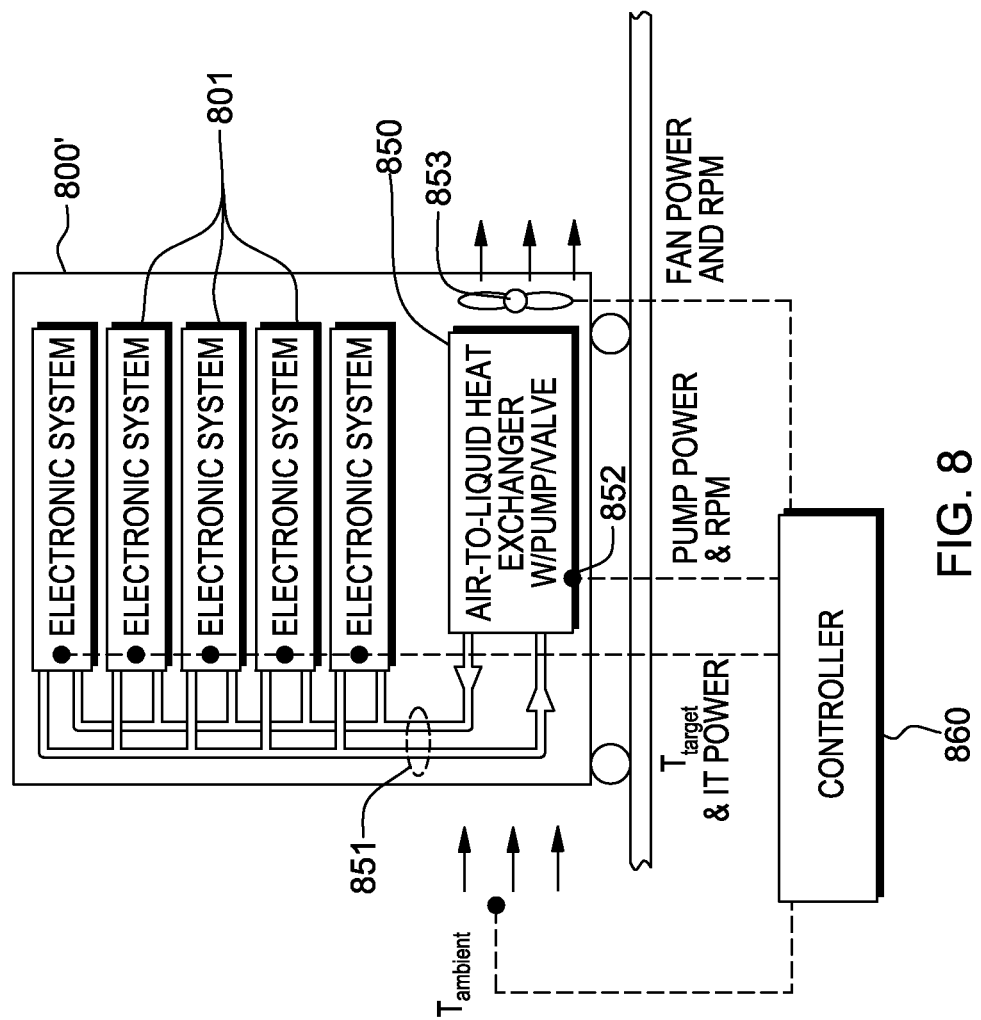
FIG. 8 is a schematic diagram of a further embodiment of a cooling system cooling one or more electronic systems, which may employ modular pumping units (MPUs), in accordance with one or more aspects of the present invention.

FIG. 8 depicts another alternate embodiment of a cooled electronic system which comprises an electronics rack 800 with multiple electronic systems (or subsystems) 801, such as the coolant-cooled electronic systems described above. An air-to-liquid heat exchanger 850 provides cooled coolant via a coolant loop 851 to the electronic systems 801 within electronics rack 800. A controller 860 provides energy efficient cooling control of the cooling system and electronic system and, in one embodiment, couples to a pump 852 of air-to-liquid heat exchange unit 850 to control a flow rate of coolant through coolant loop 851, as well as to an air-moving device, such as a fan 853 associated with the air-to-liquid heat exchange unit 850. In addition to sensing pump and fan power or speed (RPMs), controller 860 is coupled to sense a targeted temperature ($T_{target}$) at, for example, the coolant inputs to the individual electronic systems 801, as well as electronic system power being consumed (IT power), and the ambient airflow temperature ($T_{ambient}$).

FIG. 8 depicts an example of a cooled electronic system which comprises a controller (or control system), which may implement reduced power consumption cooling control, in accordance with aspects of the present invention. Note that as used herein, a controller or control system may comprise, by way of example, a computer or a programmable logic controller. The control system may include, for instance, a processor (e.g., a central processing unit), a memory (e.g., main memory), and multiple input/output (I/O) connections, interfaces, devices, etc., coupled together via one or more buses and/or other connections. In one application, the controller or control system couples to a plurality of sensors, such as temperature, pressure, or position sensors, as well as (optionally) to one or more actuators for controlling, for instance, coolant pump speed, fan speed, or position of one or more recirculation valves. Note that the input/output sense and control arrangements may be integrated within the controller or control system, or they may be external I/O modules or devices coupled to the controller which facilitate the desired sensing and actuation functions.

Typically, the heat exchanger or heat exchange assemblies employed by cooling systems such as described above in connection with FIGS. 2-8 comprise conventional, non-modular, plumbing systems, which can introduce potential leak sites, especially at locations where field-servicing requires coolant loops to be broken. Typically, when a coolant leak occurs in an IT rack or electronic system utilizing liquid-cooling to move the heat to a heat sink, the electronic system needs to be shut down for repair of the coolant leak. For example, the above-described solutions to providing liquid-cooling to an IT rack are typically made up of single, non-redundant components, which require shutting down of the electronic system or rack to service and/or replace a failed or failing component. Disclosed hereinbelow are enhanced cooling systems which address this issue, and allow for servicing of the cooling system without shutting down the respective electronic system(s) or rack.

Generally stated, disclosed herein, in one aspect, is an apparatus which comprises a modular pumping unit (MPU) configured to couple to and facilitate pumping of coolant through a cooling apparatus assisting in removal of heat generated by one or more electronic systems. The modular pumping unit is a field-replaceable unit which couples to the cooling apparatus in parallel fluid communication with one or more other modular pumping units. In one embodiment, each modular pumping unit includes: a housing; a coolant inlet to the housing; a coolant reservoir tank disposed within the housing and in fluid communication with the coolant inlet; a coolant pump disposed within the housing and configured to pump coolant from the coolant reservoir tank; and a coolant outlet of the housing, the coolant pump being coupled in fluid communication between the coolant reservoir tank and the coolant outlet, wherein the coolant inlet and the coolant outlet facilitate coupling of the modular pumping unit in fluid communication with the cooling apparatus. The apparatus further includes a controller associated with the modular pumping unit. The controller controls the coolant pump of the modular pumping unit, and (in one embodiment) automatically adjusts operation of the coolant pump based, at least in part, upon one or more sensed parameters.

Figure 9:
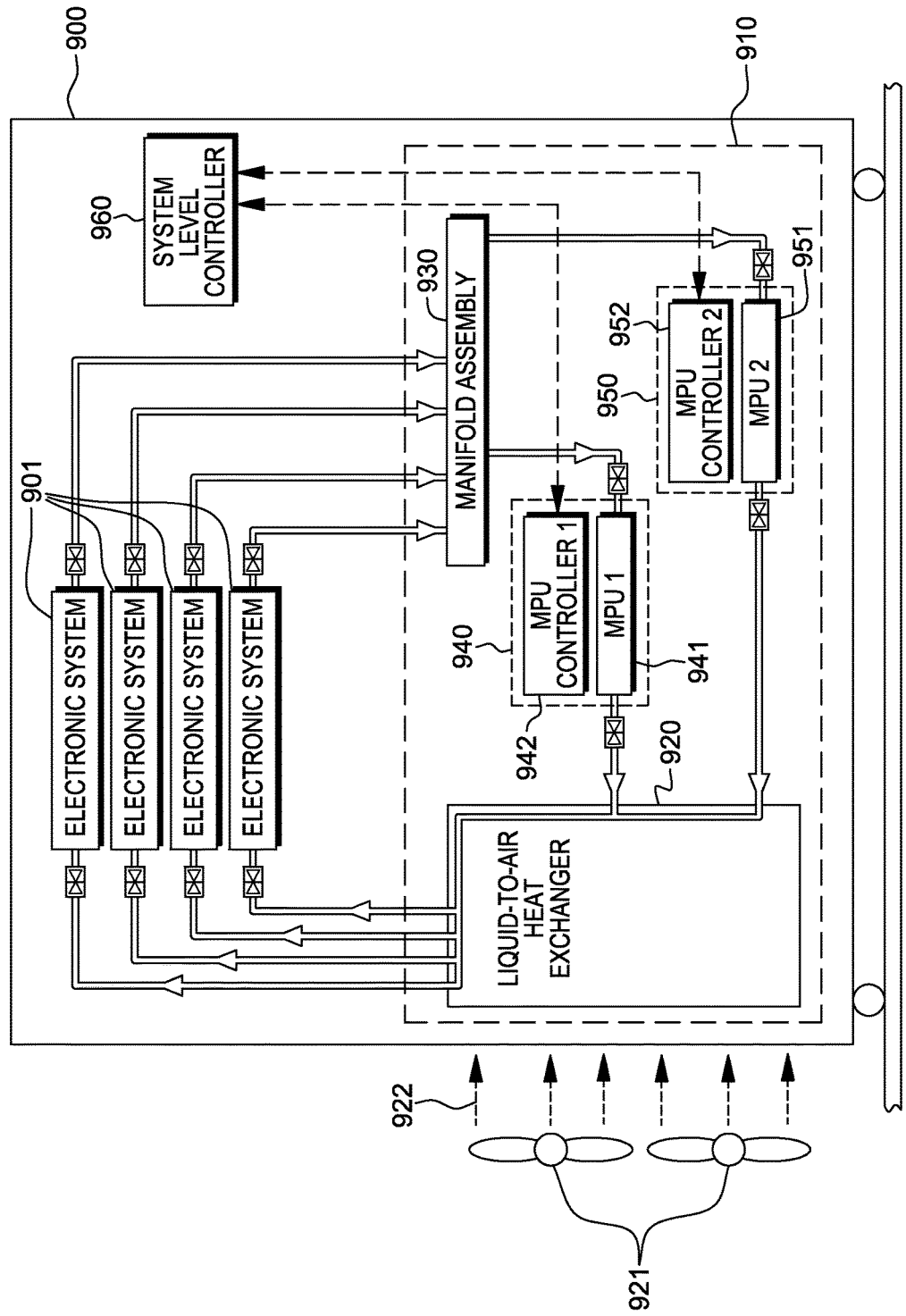
FIG. 9 depicts an alternate embodiment of a cooling system cooling one or more electronic systems and utilizing multiple modular pumping units (MPUs), in accordance with one or more aspects of the present invention.

For example, one or more coolant-level sensors may be associated with the coolant reservoir tank to sense coolant level within the coolant reservoir tank, and the controller may automatically adjust operation of the coolant pump based upon the sensed level of coolant within the coolant reservoir tank. Also, the modular pumping unit may include one or more coolant temperature sensors disposed to sense temperature of coolant passing through the housing, wherein the MPU controller automatically adjusts an operational speed of the coolant pump based upon coolant temperature sensed by the at least one coolant temperature sensor. If used with a cooling apparatus comprising a coolant-to-air heat exchanger, the MPU may be disposed so that a portion of the airflow across the coolant-to-air heat exchanger also passes through the MPU, allowing a temperature sensor to be incorporated into the MPU to sense temperature of airflow across the liquid-to-air heat exchanger. This sensed ambient air temperature may be employed to, for example, automatically adjust operation of the pump unit. Further details of such a modular pumping unit are described below in reference to the exemplary embodiment thereof depicted in FIGS. 9-12. Note in this regard, that the liquid-cooled electronic system of FIG. 9 is presented by way of example only. In particular, the modular pumping units disclosed herein may be employed with various different cooling apparatuses and systems, such as those described above in connection with FIGS. 2-8, as discussed further below.

More specifically, disclosed herein, in part, is a modular pumping unit which comprises a densely integrated, field-replaceable unit, which in one embodiment, provides substantially all functional and sensor needs for pumping and monitoring a liquid coolant used to cool, for example, one or more electronic components (such as one or more processor modules). The modular pumping unit is designed to couple, in parallel with one or more other modular pumping units, to a cooling apparatus comprising a heat exchange assembly, such as one or more of a liquid-to-liquid heat exchanger, a coolant-to-refrigerant heat exchanger, a coolant-to-air heat exchanger, etc., and may be located internal to, for example, an IT rack, or remotely from the one or more electronics racks or electronic systems being cooled by the cooling apparatus. In the embodiments disclosed herein, the apparatus further comprises a modular pumping unit controller, as well as a system-level (or frame-level) controller. The full-functional MPU disclosed herein provides coolant of the proper chemistry, filtering, and monitoring, to a customer's cooling apparatus, which includes the separate heat exchange assembly, and offers the ability of the customer to reject heat from the coolant to (for instance) the data center's water system, or to ambient air, or even to a refrigerant-based circuit, while cooling the same rack's or system's temperature-sensitive components. Redundancy at various levels is readily achieved by connecting in parallel fluid communication two or more such modular pumping units to, for example, coolant supply and coolant return manifolds of the cooling apparatus.

FIG. 9 is a schematic diagram of one embodiment of a liquid-cooled electronic system comprising, by way of example, an electronics rack 900 with multiple electronic systems 901 liquid-cooled via a cooling system or apparatus 910, which may be disposed internal to electronics rack 900 or external, and even remote from the electronics rack. The cooling system comprises, in this embodiment, a coolant-to-air heat exchanger 920, a coolant return manifold 930, and multiple pumping apparatuses 940, 950, each comprising a modular pumping unit 941, 951, in accordance with one or more aspects of the present invention. Advantageously, the modular pumping units 941, 951 are controlled to pump coolant through coolant-to-air heat exchanger 920 for distribution via the heat exchanger to, for example, one or more liquid-cooled cold plate (not shown) associated with the respective electronic systems 901. In this embodiment, the heat exchanger assembly is cooled by ambient air 922, with an airflow being provided by one or more air-moving devices 921. As explained further below, an MPU controller 1 942 is associated with first MPU 941, and an MPU controller 2 952 is associated with second MPU 951. The MPU controllers themselves facilitate cooling system control via a system-level controller 960.

In operation, heat generated within the electronic systems 901 is extracted by coolant flowing through (for example) respective cold plates, and is returned via the coolant return manifold 930 and the active modular pumping unit(s), for example, MPU #1 941 (in one example) to the coolant-to-air heat exchanger 920 for rejection of the heat from the coolant to the ambient air passing across the heat exchanger. In this example, only one modular pumping unit need be active at a time, and the MPU redundancy allows for, for example, servicing or replacement of an inactive modular pumping unit from the cooling system, without requiring shut-off of the electronic systems or electronics rack being cooled. By way of specific example, quick connect couplings may be employed, along with appropriately sized and configured hoses to couple, for example, the heat exchanger, cold plates, return manifold, and pumping units. Redundant air-moving devices 921, with appropriate drive cards, may be mounted to direct ambient airflow across the coolant-to-air heat exchanger. These drive cards may be controlled by system-level controller 960, in one embodiment. By way of example, multiple air-moving devices may be running at the same time.

The MPU controllers associated with the respective MPUs may be disposed on or within the respective MPU or, for example, associated with the MPU. In one embodiment, the MPU controllers can turn on/off the respective coolant pumps, as well as adjust speed of the coolant pump. The state of the MPU is relayed by the MPU controller 942, 952 to the system-level controller 960. The system-level controller 960 provides system level control for, at least in part, the cooling system. The system-level controller may be disposed, for example, within the electronics rack 900, or remotely from the electronics rack, for example, at a central data center location. As described below, the system-level controller determines, in one embodiment, when switchover of MPUs is to be made and, for example, determines when an MPU has a defect requiring switchover to a redundant MPU for replacement of the defective MPU.

As noted, although depicted in FIG. 9 with respect to a coolant-to-air heat exchanger, the field-replaceable, modular pumping units disclosed herein may provide pumped coolant (such as water) for circulation through various types of heat exchange assemblies, including a coolant-to-air heat exchanger, a liquid-to-liquid heat exchanger, a rack-mounted door heat exchanger, a coolant-to-refrigerant heat exchanger, etc. Further, the heat exchange assembly may comprise more than one heat exchanger, including more than one type of heat exchanger, depending upon the implementation. The heat exchange assembly, or more generally heat rejection device, could be within the liquid-cooled electronics rack, or positioned remotely from the rack.

The modular pumping unit(s) comprises a recirculation coolant loop which: receives exhausted coolant from the electronics rack into a coolant reservoir tank, pressurizes the coolant via a coolant pump (such as a magnetically coupled pump), passes the pressurized coolant through a check valve, and discharges the coolant back to the electronic systems of the electronics rack via the heat exchange assembly.

Figure 10:
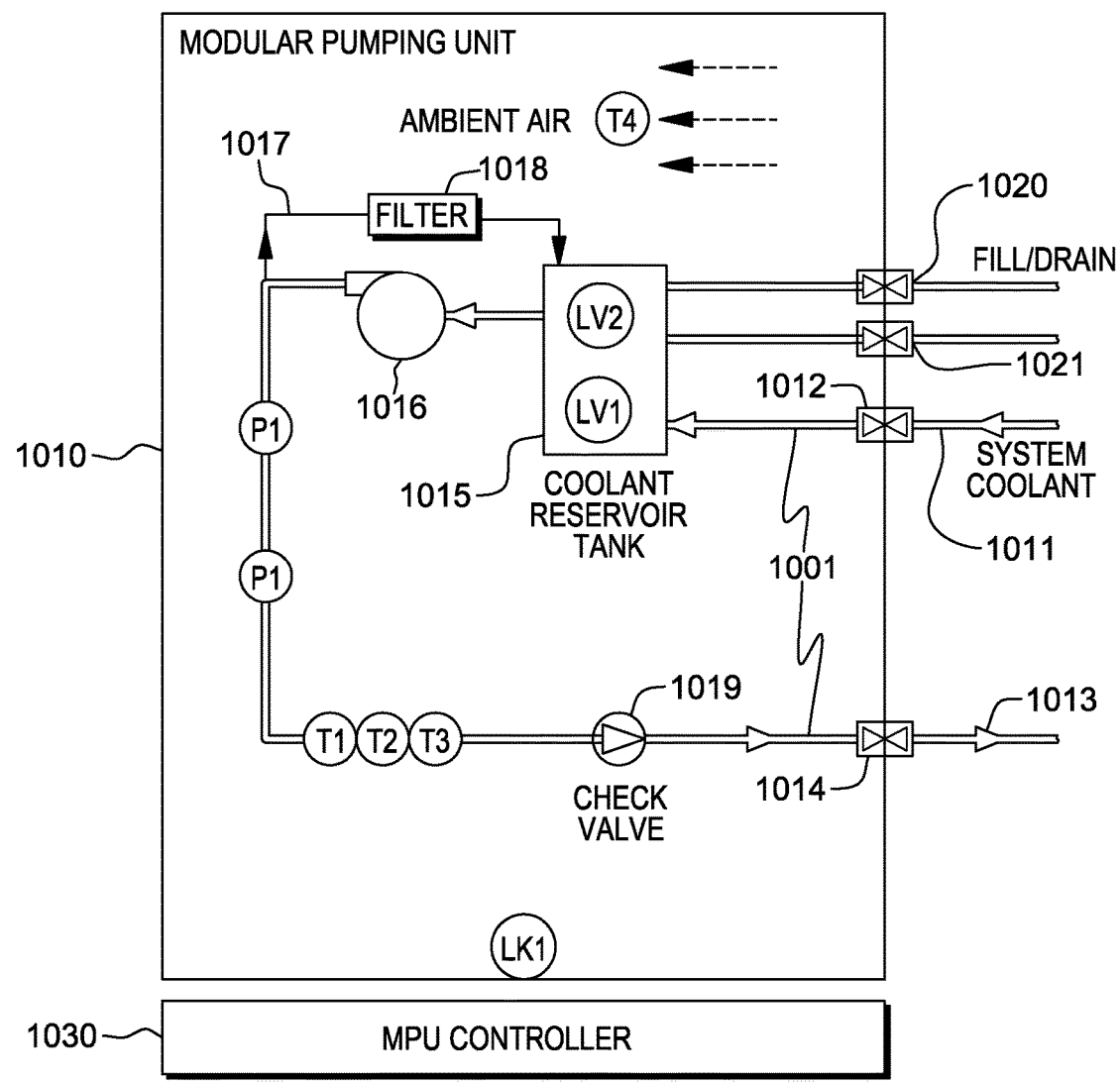
FIG. 10 is a schematic diagram of one embodiment of an apparatus comprising a modular pumping unit (MPU) and an MPU controller, in accordance with one or more aspects of the present invention.

FIG. 10 is a schematic diagram of one embodiment of a modular pumping unit, which may be employed with, for example, the cooling apparatus described above in connection with FIG. 9. In the embodiment illustrated in FIG. 10, modular pumping unit 1000 comprises a housing 1010 with a coolant inlet 1011 and a coolant outlet 1013. (In one implementation, housing 1010 may comprise a fluid-tight housing.) A coolant inlet quick connect coupling 1012 at coolant inlet 1011 and a coolant outlet quick connect coupling 1014 at coolant outlet 1013 are provided for facilitating coupling of the MPU to, for example, a cooling apparatus such as described above in connection with FIG. 9.

The modular pumping unit 1000 further comprises a coolant loop 1001 within the housing through which coolant received via the coolant inlet is re-circulated to the coolant outlet. As illustrated, coolant loop 1001 couples in fluid communication coolant inlet 1011 to a coolant reservoir tank 1015 and couples coolant reservoir tank 1015 via a coolant pump 1016 to coolant outlet 1013. A check valve 1019 is also provided within the coolant loop 1001 to prevent backflow of coolant into the modular pumping unit when the modular pumping unit is off, but coupled in fluid communication with the cooling apparatus. In one example, the coolant pump 1016 comprises a centrifugal pump, and a portion of the coolant pumped from coolant reservoir tank 1015 via the coolant pump 1016 is returned via a coolant return line 1017 through a coolant filter 1018 to the coolant reservoir tank 1015. One or more coolant fill or drain connections 1020, 1021 may be provided at housing 1010 into coolant reservoir tank 1015 to, for example, facilitate filling or draining of coolant or air from the coolant reservoir tank, and thereby facilitate field-replaceability of the modular pumping unit in parallel fluid communication with one or more other modular pumping units, without requiring shutdown of the respective electronic systems or electronics rack being cooled.

Advantageously, modular pumping unit 1000 further comprises multiple sensors, and has associated therewith an MPU controller 1030 for facilitating automated monitoring of coolant passing through the MPU, as well as operation of the MPU itself. In the depicted embodiment, modular pumping unit 1000 comprises, for example, a lower-level coolant reservoir sensor LV1, an upper-level coolant reservoir sensor LV2, an outlet pressure sensor P1, a coolant flow rate sensor F1, multiple coolant temperature sensors T1, T2 & T3, an ambient airflow temperature sensor T4, and a coolant leak sensor LK1. In one embodiment, these sensors are disposed within the MPU and allow the controller to control, for example, operation and/or an operational speed of coolant pump 1016, in order (for example) to provide an appropriate level of cooling to the electronic systems or rack. The MPU controller reads the sensed values and responds to the sensor values, along with providing diagnostic information to the system-level controller (such as described above in connection with FIG. 9). The sensors also provide information which can assist in the initial filling of the modular pumping unit, and the cooling system, and can indicate the need to, for example, top off a coolant level or to remove air pockets, as well as provide an indication that the coolant pump does not have sufficient coolant, requiring the coolant pump to be shut off to prevent damage. The sensors also provide diagnostic information to the system-level controller which can be used to determine, for example, the operational state of the modular pumping unit, and to act on that information.

Figure 11A:
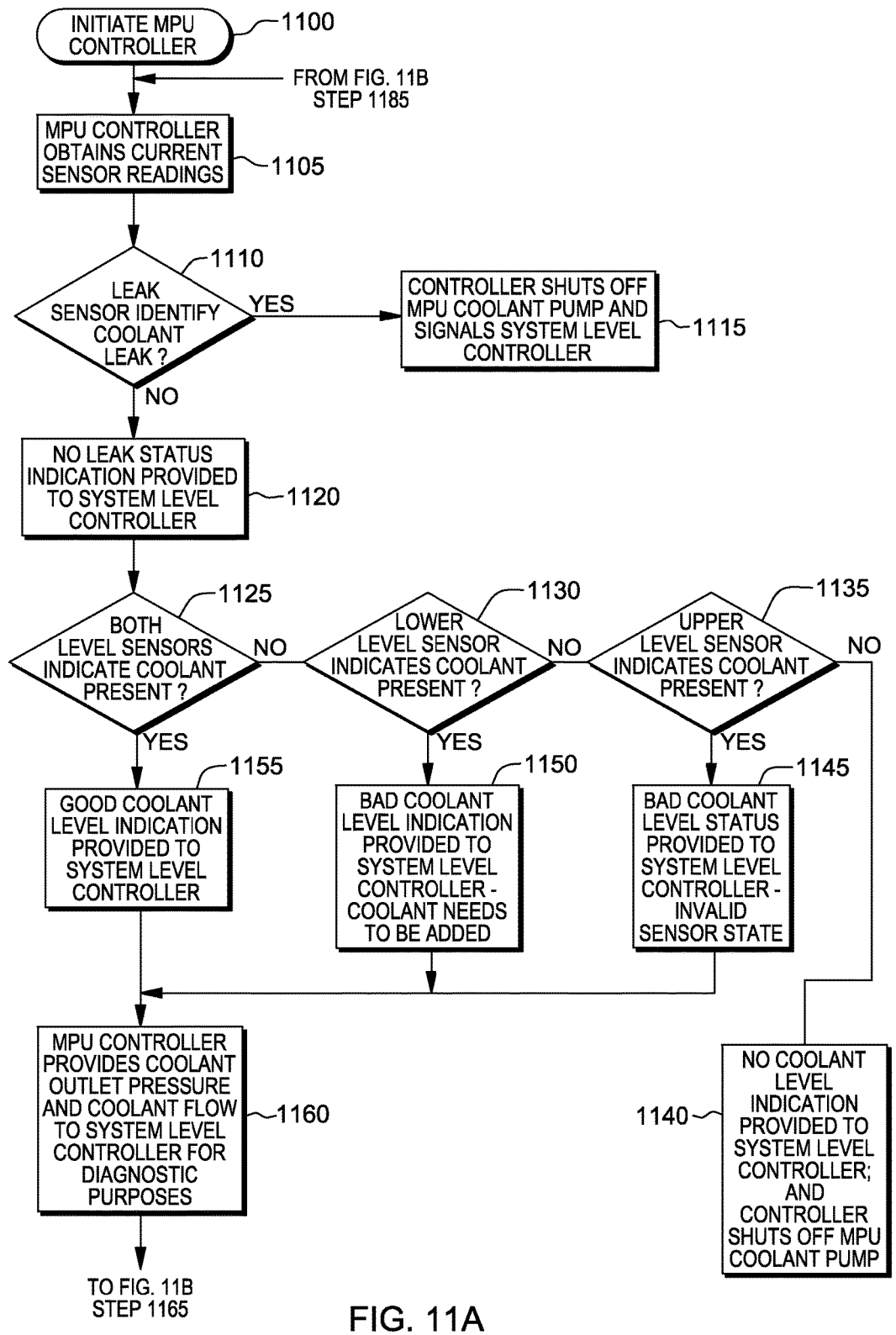
FIGS. 11A & 11B are a flowchart of one embodiment of a control process implemented by a modular pumping unit (MPU) controller, in accordance with one or more aspects of the present invention.
Figure 11B:
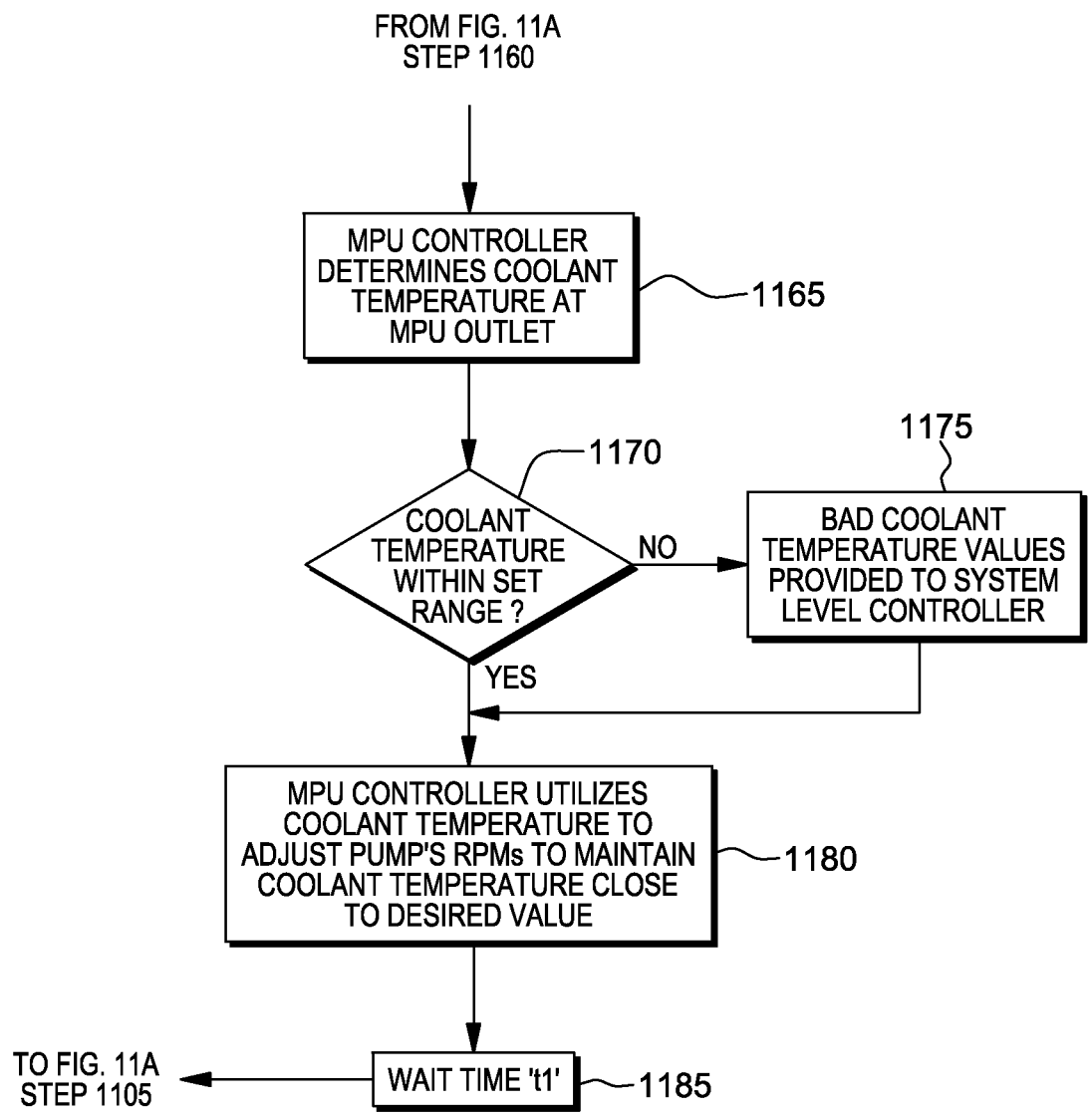

FIGS. 11A & 11B depict one embodiment of a control process implemented, for example, by an MPU controller of a modular pumping unit, such as described above in connection with FIGS. 9 & 10. Upon initiating MPU control 1100, the MPU controller obtains (for example, every t1 seconds) current sensor readings of the associated modular pumping unit 1105. Processing determines whether the leak sensor (LK1) indicates that there is a coolant leak 1110. If "yes", then the controller shuts off the MPU's coolant pump, and signals the system-level controller that there is a coolant leak 1115 (at which point the system-level controller switches the redundant modular pumping unit (or one of the redundant units) on to take over the pumping load for the cooling apparatus). Assuming that the leak sensor (LK1) does not indicate a coolant leak, then the MPU controller provides the system-level controller with a no leak status indication 1120.

The control process also determines whether both level sensors in the coolant reservoir tank indicate the presence of coolant 1125. If "no", then processing determines whether the lower-level sensor indicates the presence of coolant 1130, and if "no" again, determines whether the upper-level sensor indicates the presence of coolant 1135. If neither sensor indicates the presence of coolant, then the MPU controller provides a no coolant indication to the system-level controller, and shuts off the MPU's coolant pump 1140. Alternatively, if the upper-level sensor indicates the presence of coolant but not the lower-level sensor, then a bad coolant level signal is provided to the system-level controller, since an invalid sensor state has been identified 1145. If the lower-level sensor indicates the presence of coolant but not the upper-level sensor, then a bad coolant level indication is provided to the system-level controller, indicating that coolant needs to be added to the coolant reservoir tank 1150. If both level sensors indicate the presence of coolant, then a good coolant level indication is provided to the system-level controller 1155.

Additionally, the MPU controller may provide a coolant outlet pressure reading and a coolant flow reading to the system-level controller, for example, for diagnostic purposes 1160. The MPU controller may also determine the temperature of the coolant flowing, for example, to the MPU outlet 1165 (see FIG. 11B). This may be ascertained via a single temperature sensor, or multiple temperature sensors. In the embodiment of FIG. 10, three temperature sensors T1, T2, & T3, are employed. A valid average temperature for these temperature sensors may be created. Any value outside a possible acceptable range would not be included in the average, and if obtained, a bad status indication may be provided by the MPU controller to the system-level controller. In one implementation, the temperature differences may be ascertained (for example, T1-T2, T1-T3, and T2-T3). If the values are below a certain threshold, then the average of T1, T2 and T3 may be obtained. If the values are outside a limit or a range, then a poor coolant temperature is identified, and an appropriate status indication is provided to the system-level controller. In the embodiment of FIG. 11B, the MPU controller determines whether the coolant temperature is within a set range 1170, and if "no", forwards the bad coolant temperature value(s) to the system-level controller 1175.

Advantageously, the MPU controller may also utilize coolant temperature to adjust the coolant pump's RPMs to, for example, maintain coolant temperature close to a desired value 1180. After this automatic adjustment of the coolant pump, processing may wait time interval t1 1185 before obtaining a new set of sensor readings 1105. In one example, time interval t1 may be 1 second.

Figure 12:
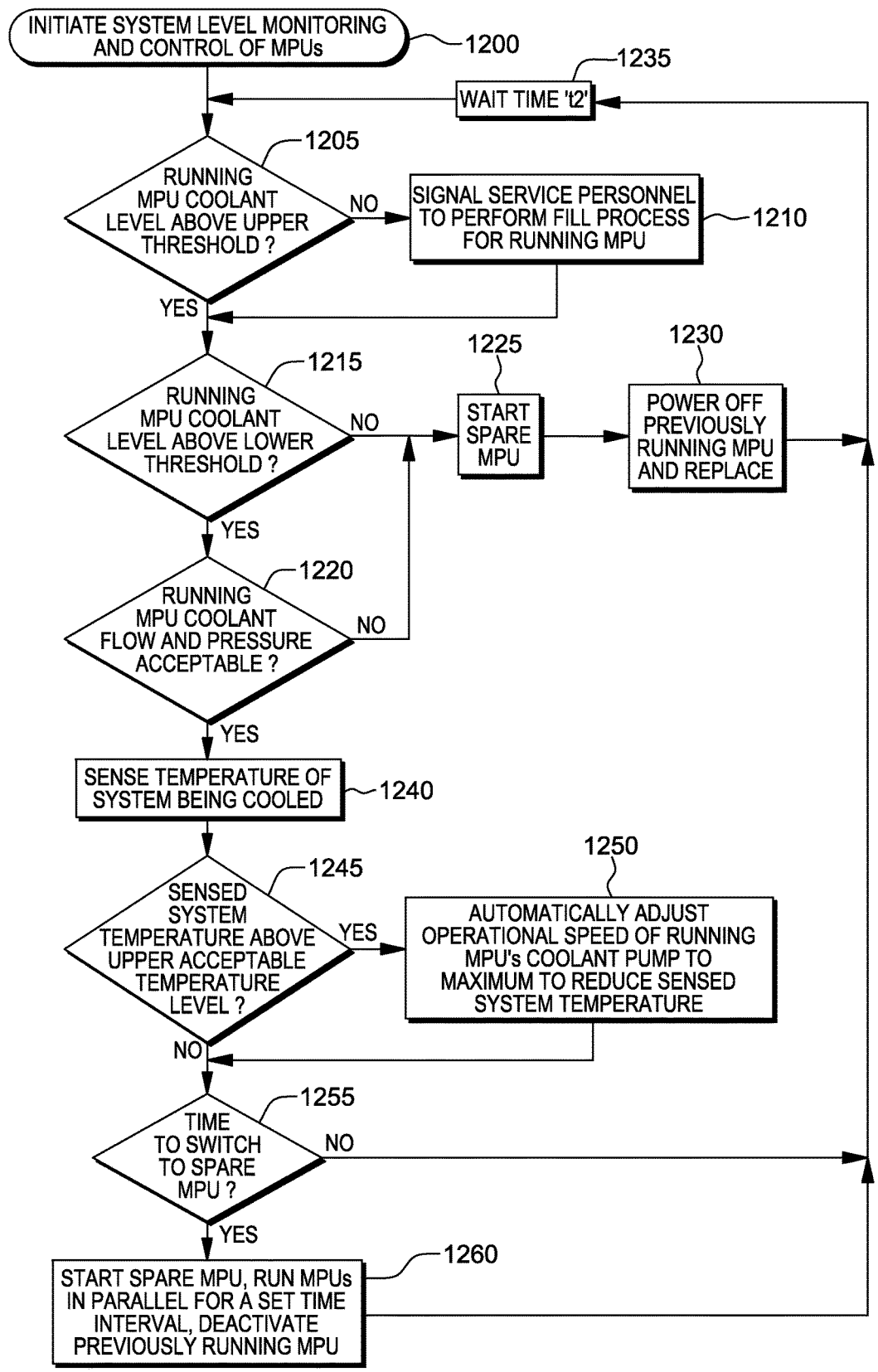
FIG. 12 is a flowchart of one embodiment of a control process implemented by a system-level controller of a cooling system comprising multiple modular pumping units (MPUs), in accordance with one or more aspects of the present invention.

FIG. 12 depicts one embodiment of processing implemented by a system-level controller. In this example, upon initiating system-level monitoring and control of the MPUs 1200, processing determines whether the running MPU's coolant level in the coolant reservoir tank is above an upper operational level 1205, for example, at or above the upper-level sensor in the coolant reservoir tank of FIG. 10. If "no", then service personnel is signaled to perform a coolant fill process for the active MPU 1210. Processing also determines whether the MPU coolant level is at or above a lower acceptable threshold 1215, and if "yes", whether the running MPU's coolant flow and pressure are above acceptable respective thresholds 1220. If either is "no", then a spare modular pumping unit that is coupled to in parallel fluid communication with the running MPU is started 1225, after which the previously running MPU is powered off and replaced 1230. Processing then waits a time interval t2 before again checking the coolant level within the coolant reservoir tank 1235. Assuming that the coolant level is acceptable, and that the flow and pressure readings are acceptable, the system-level controller ascertains one or more temperatures of the electronic system being cooled 1240, and determines whether the sensed electronic system temperature(s) is above an upper acceptable temperature threshold 1245. If so, then the system-level controller automatically adjusts operational speed of the active MPU's control pump to maximum to attempt reduction in the sensed system temperature 1250. After adjusting operational speed, or if system temperature is acceptable, processing determines whether it is time to switch the pumping function from the active, running MPU, to a spare MPU coupled in parallel fluid communication 1255. If "no", processing waits time t2 1235 before repeating the processing. If "yes", then the system-level controller initiates operation of a spare MPU, runs the two MPUs in parallel for a set time interval, and then deactivates the previously running MPU 1260, thereby accomplishing the switchover of the pumping load from the previously running MPU to the recently-started MPU. After switching pumping operation, processing waits time t2 1235, before again repeating the above-described processing.

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 13:
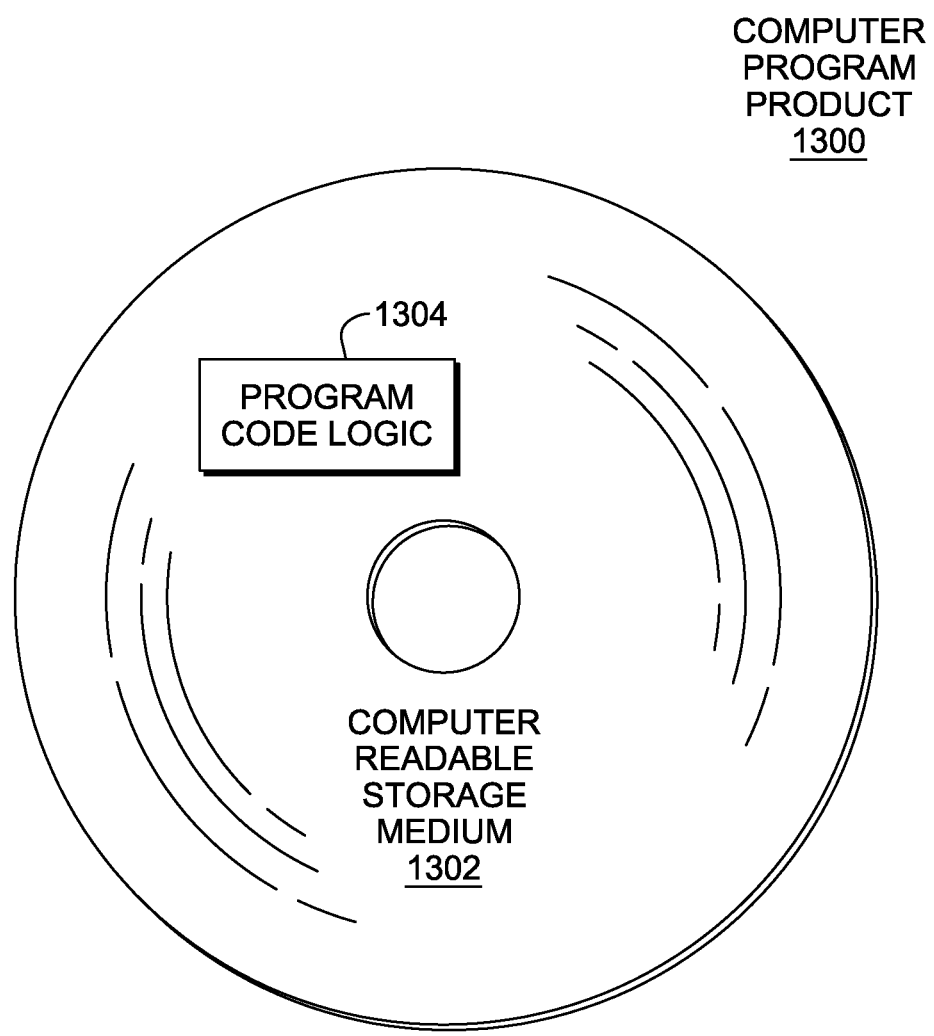
FIG. 13 depicts one embodiment of a computer program product incorporating one or more aspects of the present invention.

Referring to FIG. 13, in one example, a computer program product 1300 includes, for instance, one or more non-transitory computer readable storage media 1302 to store computer readable program code means or logic 1304 thereon to provide and facilitate one or more aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more control aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more control aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

In the modular pumping unit example described above in connection with FIGS. 10-12, one or more fluid sensors are employed with a coolant reservoir of the coolant loop to sense level of coolant within the reservoir. Generally, in liquid or coolant-cooled systems, a need exists to monitor, for instance, the height of the coolant within the fluid system, such as within a coolant reservoir, tank, manifold, etc. The coolant cooled system may or may not be pressurized during normal operation. However, Underwriters Laboratory/Canadian Standards Association (UL/CSA) certification testing may require pressurization of the fluid system to, for example, 3×-5× normal operating pressure. During such certification testing, there can be no leaks from the system. Therefore, a need exists in the art for a fluid sense apparatus which is able to accurately, reliably sense coolant level within, for example, a coolant reservoir or manifold, while also allowing for pressurization of the fluid system (for example, during testing thereof) without leaking or malfunctioning.

Prior approaches to sensing presence of fluid within a reservoir include mechanical floats, as well as optical sensors. Unfortunately, mechanical floats can become contaminated and optical sensors may signal false dry indications should bubbles collect near the sensor. Another approach would be to employ a proximity sensor to measure, for example, water through the wall of a plastic tank. Generally, however, existing applications of proximity sensors are low pressure applications. Disclosed herein with reference to FIGS. 14A-17B are various fluid sense apparatuses which employ (in one embodiment) proximity sensors to measure presence of fluid within the fluid system to, for example, ascertain a fluid level (e.g., within a coolant reservoir). The fluid sense apparatuses disclosed herein function without leaking, notwithstanding system/test pressures which can be 100 PSI, or higher.

Generally stated, disclosed herein is a fluid sense apparatus which includes a plug configured to couple to a wall of a fluid system at an opening in the wall and to form a fluid-tight seal with the wall about the opening. The plug includes a fluid-sensor-receiving space configured to at least partially receive therein a fluid sensor and, when the plug is coupled to the wall at the opening, to position the fluid sensor at the opening in a manner to facilitate sensing of fluid within the fluid system. Advantageously, the fluid sensor remains separated from the fluid and is removable from the fluid-sensor-receiving space of the plug without requiring uncoupling of the plug from the wall. By way of example, the fluid sensor may comprise a proximity sensor, and the plug may be a threaded plug capable of withstanding the required pressures, while also positioning the fluid sensor to measure or sense fluid level within the fluid system. By allowing the fluid sensor to be removable from the fluid-sensor-receiving space, slot, recess, etc., without requiring removal of the plug from the opening in the wall, the fluid sensor may be replaced, without interrupting operation of the fluid system. In one example, the fluid system comprises a coolant-based cooling apparatus configured to facilitate removal of heat generated by one or more electronic components. The cooling apparatus includes a coolant flow path or loop comprising (in one embodiment) a coolant reservoir (e.g., such as depicted in connection with FIG. 10, and described above). In one implementation, the plug is fabricated of a non-conductive material, the coolant reservoir is fabricated of a conductive material (e.g., stainless steel, which is able to withstand the necessary pressurization), and the fluid sensor is a proximity sensor. The fluid sense apparatus disclosed herein advantageously allows a proximity sensor to be employed in association with a fluid system that is configured to either be pressurized, or to undergo higher pressure testing/certification without leaking. The plug is configured, in one embodiment, as a threaded plug designed to withstand the required pressure (s), while also positioning the fluid sensor in a manner to facilitate measurement of fluid level within the system.

As noted, and by way of example only, the fluid sensor may comprise a proximity sensor. As one specific example, the proximity sensor may be a TS-100 TouchCell™ proximity sensor, such as commercially available from Touch-Sensor Technologies, LLC of Wheaton, Ill., USA. In operation, a proximity sensor typically generates an electric field, and a change in the electric field is induced when the sensor is brought close to a dense object, such as a fluid (for instance, water or other coolant). The change in electric field is sensed, causing a digital indication. Commercially available proximity sensors may be similarly sized to a secure digital (SD) memory card (e.g., 1"×¾"). Proximity sensors are used extensively in various industries, most all of which are low pressure applications.

Figure 14A:
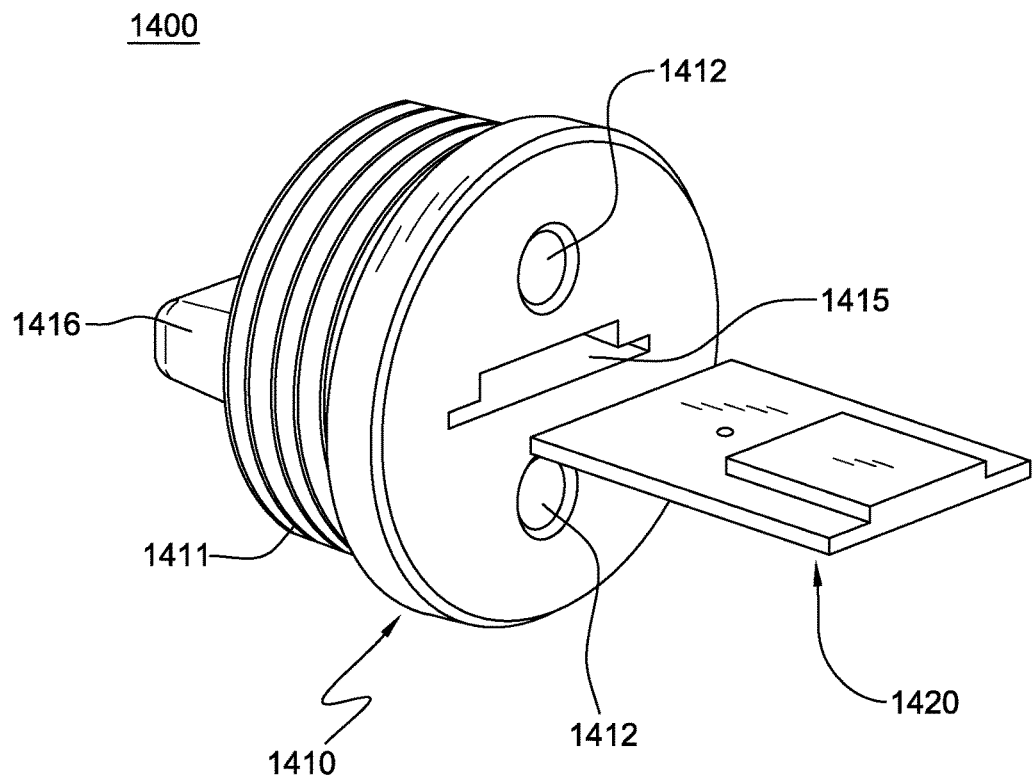
FIG. 14A depicts one embodiment of a fluid sense apparatus, shown with the fluid sensor removed from the fluid-sensor-receiving space of the plug of the fluid sense apparatus, in accordance with one or more aspects of the present invention.
Figure 14B:
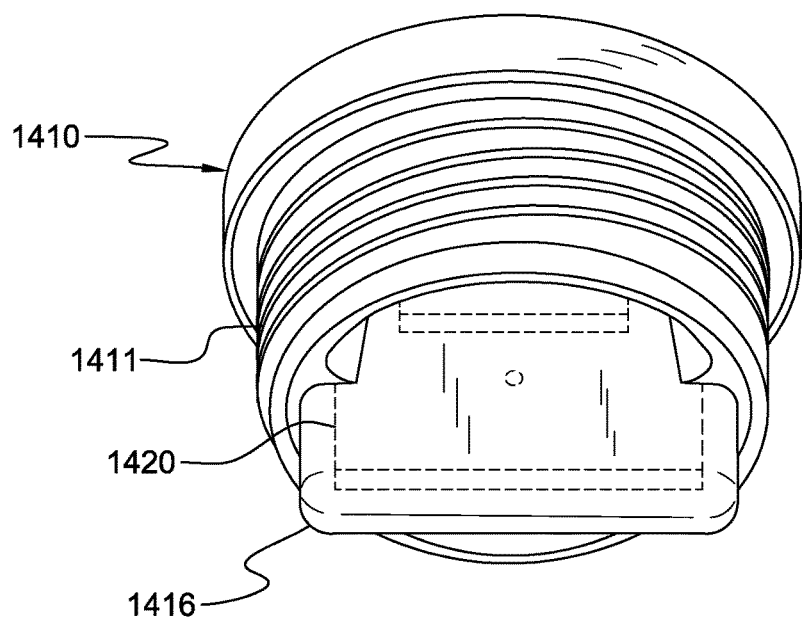
FIG. 14B depicts the fluid sense apparatus of FIG. 14A, with the fluid sensor inserted in operative position within the fluid-sensor-receiving space of the plug, and illustrating a fluid sense window of the plug configured to project into a fluid system to facilitate sensing of fluid within the system, in accordance with one or more aspects of the present invention.

Referring collectively to FIG. 14A and FIG. 14B, one embodiment of a fluid sense apparatus, generally denoted a 1400, is illustrated. Fluid sense apparatus 1400 includes a plug 1410 with a fluid-sensor-receiving space 1415. Also shown is a fluid sensor 1420 sized and configured to be received within fluid-sensor-receiving space 1415. In this embodiment, fluid sensor 1420 is illustrated (by way of example only) as a commercially available proximity sensor. Depending on the configuration of the fluid sensor 1420, the configuration of the fluid-sensor-receiving space 1415 within plug 1410 may vary.

In the embodiment depicted, plug 1410 comprises threads 1411 which facilitate threading of the plug into an opening in a wall of, for example, a coolant flow path or loop, and more particularly, a coolant reservoir or manifold, as explained further below. Plug 1410 further includes frontal recesses 1412 which facilitate tightening of the plug within a threaded opening in a wall using a pronged tool (not shown). A fluid sense window 1416 is provided in plug 1410. In the depicted embodiment, fluid sense window 1416 is tongue-shaped so as to extend into the fluid system when the plug is coupled to the wall of the fluid system at an opening therein. As shown in FIG. 14B, the fluid sensor, which as noted, may be a proximity sensor in one example, resides at least partially within the tongue-shaped fluid sense window 1416 so that depending upon the level of fluid within the fluid system, fluid (such as water or other coolant) may surround the fluid sense window 1416 on either side of the window. This configuration thus facilitates proximity sensing of the fluid through the window. Note that the tongue-shaped fluid sense window, and thus the fluid-sensor-receiving space which extends (in this embodiment) into the tongue-shaped fluid sense window, may be oriented horizontally, vertically, or any angle in-between when the plug 1410 is operatively inserted into an opening in a wall of a fluid system. In FIGS. 14A & 14B, the tongue-shaped fluid sense window is shown, by way of example only, to extend horizontally (while in FIGS. 15A-15C, the tongue-shaped fluid sense window is shown, by way of further example, to extend vertically). Note also that, in one implementation, the fluid sense window 1416 is fabricated of a non-conductive material to facilitate proximity sensing by a proximity sensor disposed within the fluid-sensor-receiving space 1415 of plug 1410.

Figure 14C:
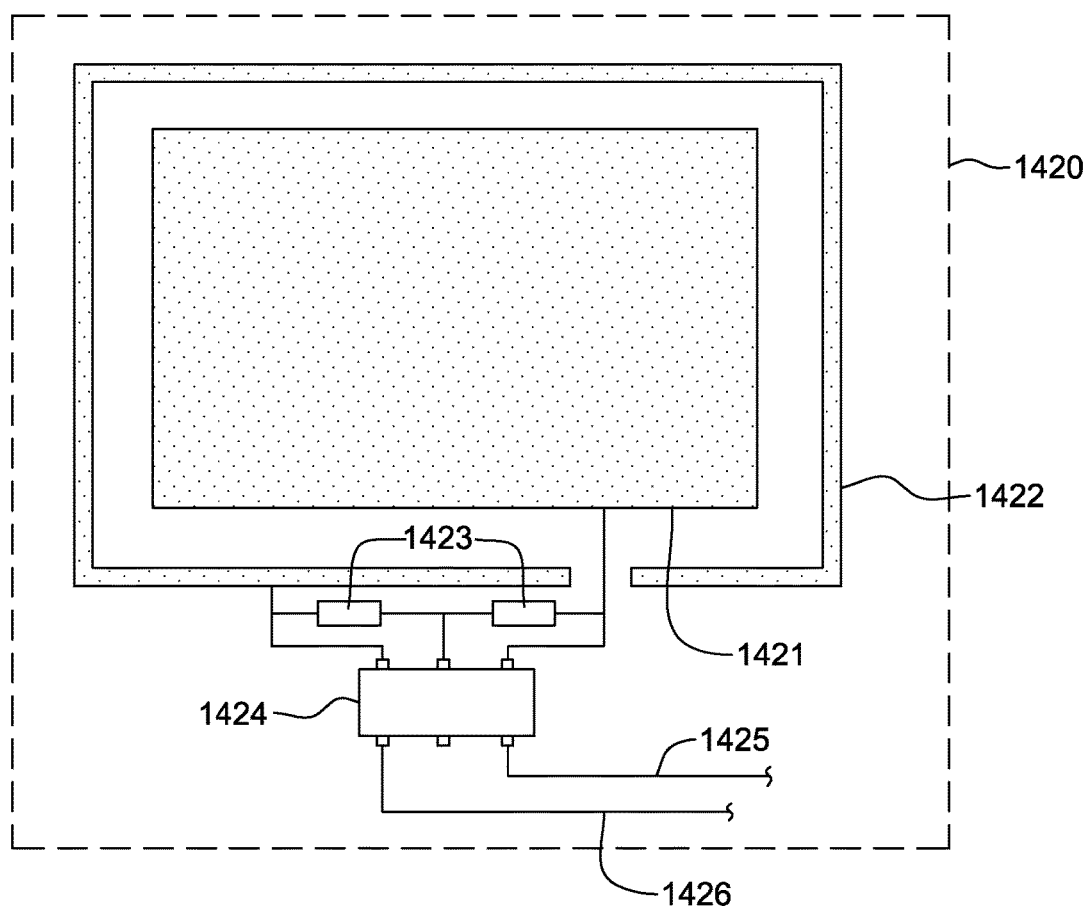
FIG. 14C is a schematic of one embodiment of a proximity sensor, which may be employed as the fluid sensor depicted in FIGS. 14A and 14B, in accordance with one or more aspects of the present invention.

FIG. 14C is a schematic of one embodiment of a fluid sensor 1420 configured as a proximity sensor. In this embodiment, the proximity sensor, which may comprise a TS-100 TouchCell™ sensor such as marketed by TouchSensor Technologies, LLC, includes a first electrode 1421 and second electrode 1422 for establishing an electric field. In one embodiment, electrode 1422 may comprise an electric field coil. Electrically coupled between first and second electrodes 1421, 1422 are two sensitivity resistors 1423, which provide input to a fluid sense circuit 1424. The fluid sense circuit may comprise an application-specific integrated circuit (ASIC), such as available through TouchSensor Technologies, LLC. The fluid sense circuitry 1424 includes a power input 1425, receiving, for instance, a five volt input, and a signal output 1426 for providing a signal indicative of whether fluid is present in the vicinity of the proximity sensor. In operation, the ASIC generates an electric field, senses a field disruption due to the presence of fluid, and creates an output. Sensitivity of the sensor is determined, at least in part, via the sensitivity resistors 1423.

Figure 15A:
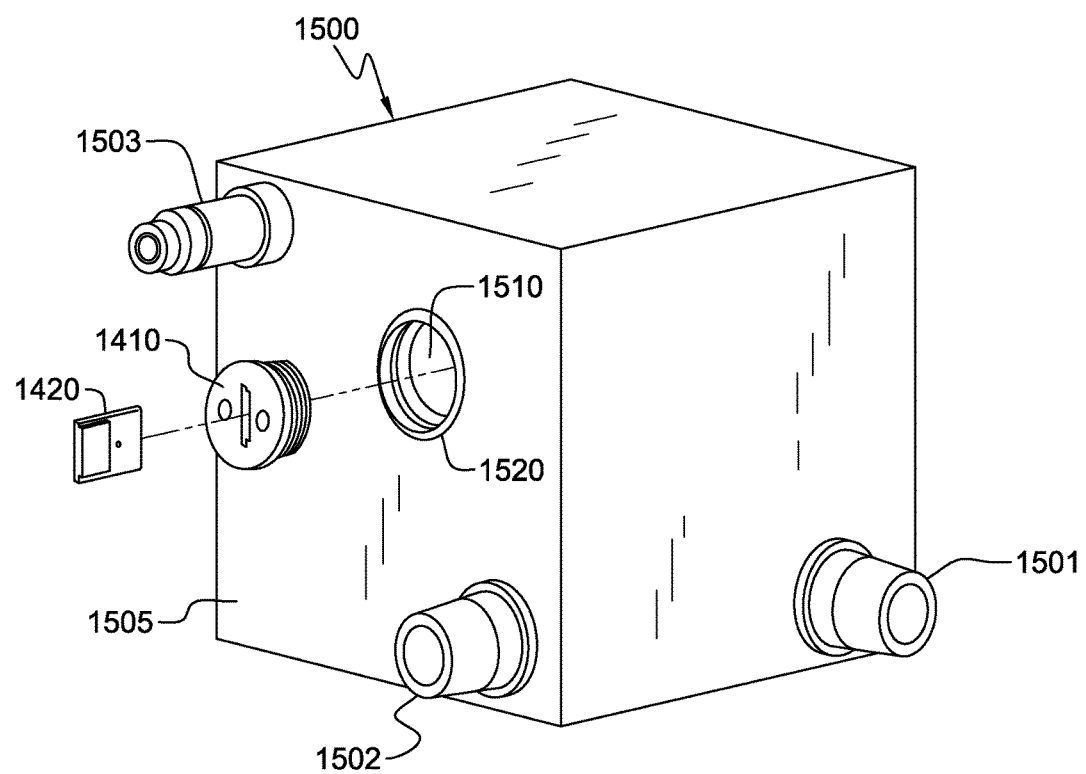
FIG. 15A depicts one embodiment of a fluid system, which may comprise a coolant reservoir of a coolant-based cooling apparatus, with a fluid sense apparatus such as depicted in FIGS. 14A and 14B partially exploded from the wall of the coolant reservoir, in accordance with one or more aspects of the present invention.
Figure 15B:
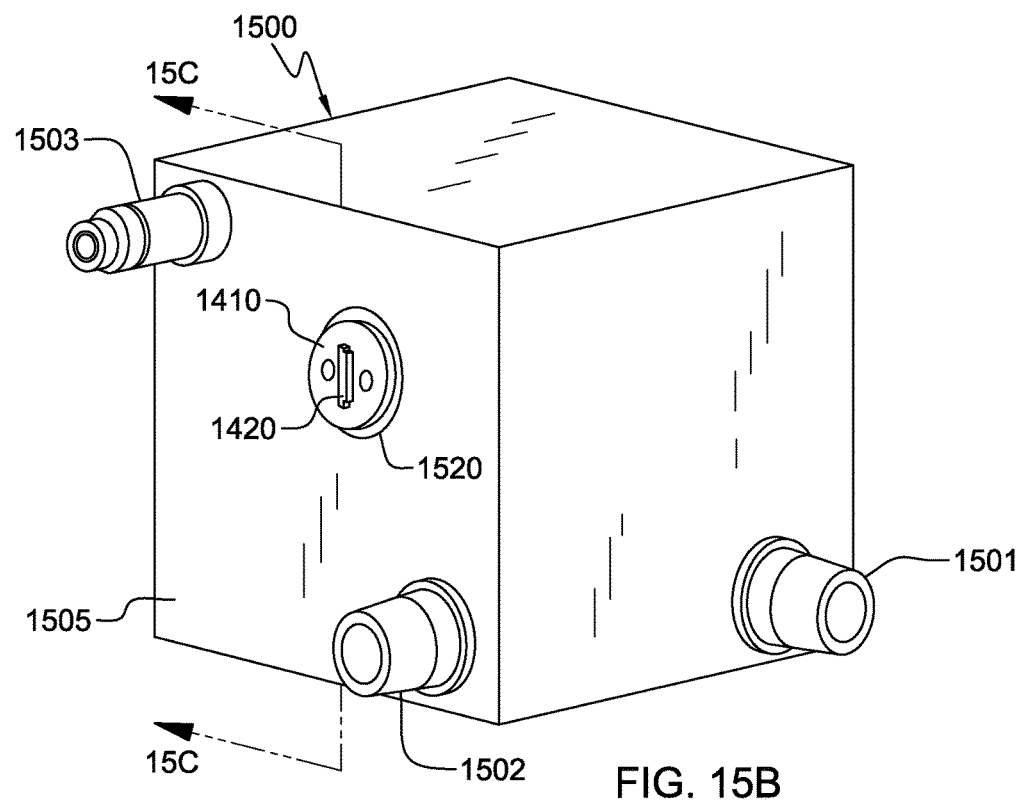
FIG. 15B illustrates the fluid system of FIG. 15A, with the fluid sense apparatus operatively threaded into position to form a fluid-tight seal about the opening in the wall of the coolant reservoir, in accordance with one or more aspects of the present invention.
Figure 15C:
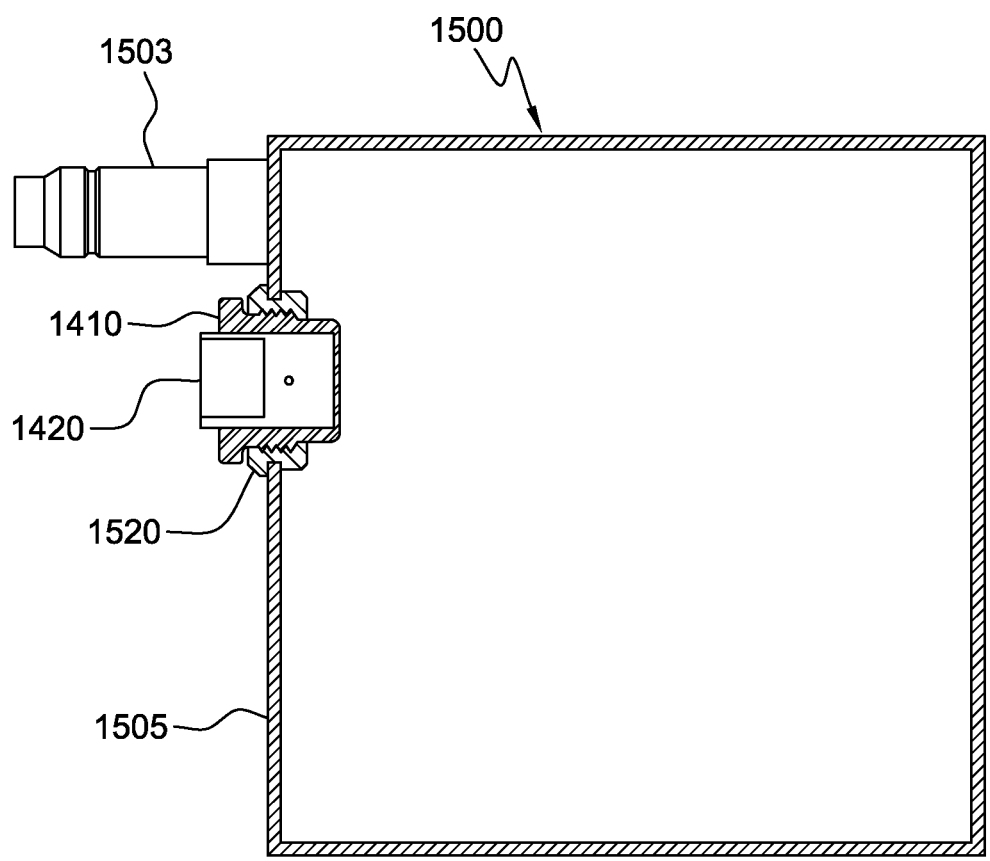
FIG. 15C is a cross-sectional elevational view of the coolant reservoir and fluid sense apparatus of FIG. 15B, taken along line 15C-15C thereof, in accordance with one or more aspects of the present invention.

FIGS. 15A-15C depict one embodiment of a portion of a fluid system, such as for instance, one or more of the above-described coolant-based coolant apparatuses or systems. In particular, FIGS. 15A-15C depict one embodiment of a coolant reservoir 1500 such as might be employed in the coolant loop of the above-described cooling apparatus of FIGS. 10-12. Note, however, that this figure is presented by way of one example only, and not by way of limitation. The fluid sense apparatuses disclosed herein may be employed with a wide variety of fluid systems, including a wide variety of fluid reservoirs, tanks, manifolds, etc., to evaluate fluid level within the system, which is also referred to herein as the coolant loop.

Referring collectively to FIGS. 15A-15C, coolant reservoir 1500 is fabricated (in one embodiment only), of a material that is able to withstand higher pressures, such as might be required during UL/CSA certification testing of a cooling apparatus for an electronic system or electronics rack. In one embodiment, coolant reservoir 1500 is fabricated to withstand pressures of 100 PSI, or greater. Coolant reservoir 1500 includes a coolant inlet 1501, a coolant outlet 1502, and a fill port 1503, which may be employed to provide coolant within the reservoir, and thus, within the fluid system or coolant loop which includes the reservoir. As one example, the coolant may comprise water or an aqueous-based solution.

In the depicted embodiment, coolant reservoir 1500 includes a wall 1505 within an opening 1510 therein sized to receive plug 1410, as one example. In this implementation, a threaded insert 1520 is provided about opening 1510 to facilitate threading of plug 1410 into opening 1510 in coolant reservoir 1500. In one implementation, threaded insert 1520 may be fabricated of a metal, and welded to coolant reservoir 1500 (which may also comprise a metal) in a fluid-tight manner. FIGS. 15B & 15C depict fluid sensor 1420, such as a proximity sensor, inserted in operative position within plug 1410, and plug 1410 threadably inserted into the opening. As noted, plug 1410, may be fabricated of a non-conductive material. FIG. 15C depicts that, in this embodiment, the fluid sensor is oriented transverse to the opening when the plug is positioned within the opening in the wall, and the fluid sensor extends at least partially through the opening into the coolant reservoir 1500 to, for instance, facilitate exposing the electric field generated by the sensor to the inner chamber of the coolant reservoir.

Figure 16A:
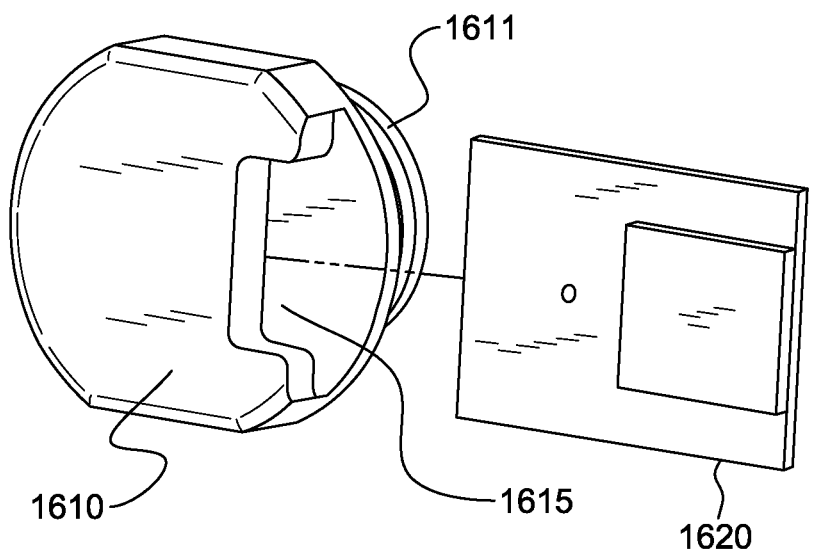
FIG. 16A depicts an alternate embodiment of a fluid sense apparatus with a fluid sensor shown removed from the fluid-sensor-receiving space of plug, in accordance with one or more aspects of the present invention.
Figure 16B:
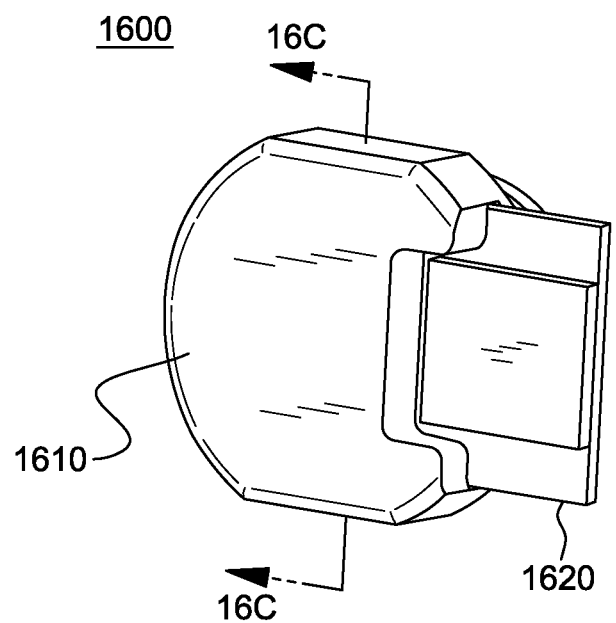
FIG. 16B depicts the fluid sense apparatus of FIG. 16A, with the fluid sensor shown disposed within the fluid-sensor-receiving space of the plug, in accordance with one or more aspects of the present invention.
Figure 16C:
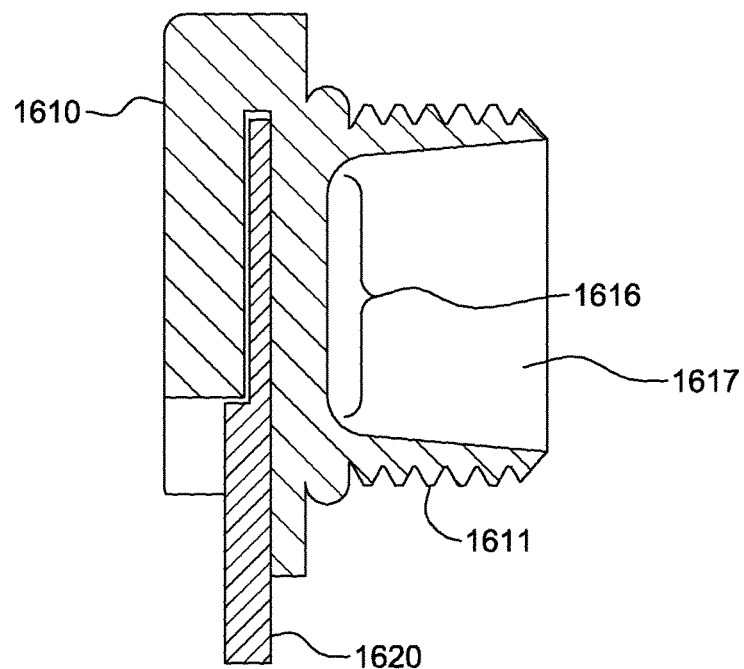
FIG. 16C is a cross-sectional elevational view of the fluid sense apparatus of FIG. 16B, taken along line 16C-16C thereof, in accordance with one or more aspects of the present invention.

FIGS. 16A-16C depict an alternate embodiment of a fluid sense apparatus 1600, in accordance with one or more aspects of the present invention. Referring collectively to FIGS. 16A-16C, fluid sense apparatus 1600 includes, in this embodiment, a plug 1610 with a fluid-sensor-receiving space 1615 formed therein size and configured to accommodate a fluid sensor 1620, which (in one embodiment) may comprise a proximity sensor such as described above. Plug 1610 includes threads 1611 for threadably engaging and sealing to an opening formed in a wall of a fluid system, such as a coolant loop, and more particularly, to a wall of a coolant reservoir, manifold, etc., of a coolant loop. In one embodiment, plug 1610 is fabricated of a non-conductive material and is configured to allow for proximity sensing of fluid within a fluid system through a fluid sense window 1616 defined in the plug adjacent to the fluid-sensor-receiving space 1615, as illustrated in FIG. 16C. In this embodiment, plug 1610 is partially hollowed, with an opening 1617 which facilitates, for example, the flow of fluid within the fluid system in close proximity to fluid sense window 1616, and thus, facilitates fluid sensing employing fluid sensor 1620. Note also that, in this configuration, the fluid-sensor-receiving space 1615 is oriented substantially parallel to the opening in the wall (see FIGS. 15A-15C), and with the fluid sensor disposed within the fluid-sensor-receiving space, positions the fluid sensor at least partially overlying the opening of the wall, and overlying the fluid sense window 1616 of the plug 1610. Note that, as with the embodiment of FIGS. 14A-15C, the fluid sensor 1620 may be removed from plug 1610 without removing the plug from the wall of the fluid system, and therefore advantageously allows for replacement of the fluid sensor without interrupting functioning of the fluid system.

Figure 17A:
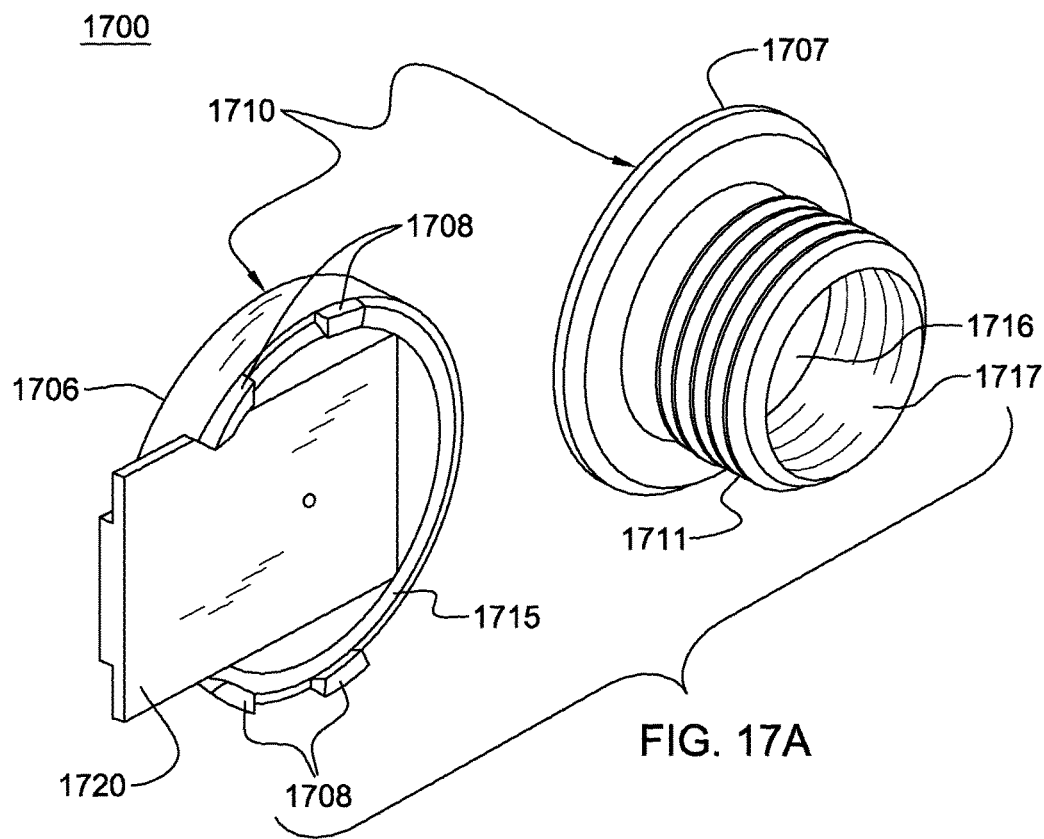
FIG. 17A depicts another embodiment of a fluid sense apparatus, with the fluid sensor shown disposed in a fluid-sensor-receiving space in an upper portion of the plug, in accordance with one or more aspects of the present invention.
Figure 17B:
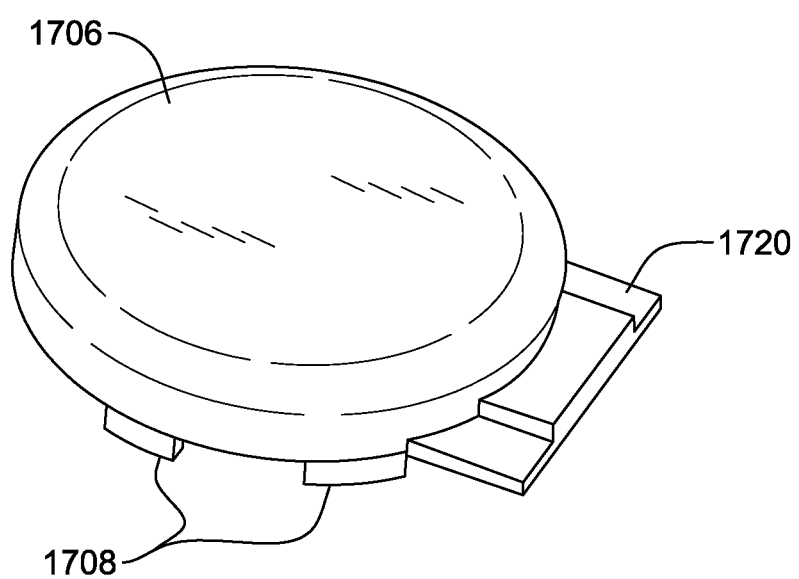
FIG. 17B depicts the fluid sense apparatus of FIG. 17A, and illustrating further one embodiment of the upper portion of the plug with the fluid sensor shown disposed in the fluid-sensor-receiving space thereof, in accordance with one or more aspects of the present invention.

FIGS. 17A & 17B depict a further embodiment of a fluid sense apparatus 1700, in accordance with one or more aspects of present invention. In this embodiment, the fluid sense apparatus comprises a two piece plug 1710, which includes an upper portion 1706 and a threaded portion 1707. Upper portion 1706 is configured to mate or snap to threaded portion 1707 and be held to the threaded portion via multiple retaining tabs or snaps 1708. In one implementation, the upper and threaded portions 1706, 1707 may comprises molded plastic portions of two piece plug 1710. Upper portion 1706 includes a fluid-sensor-receiving space 1715 (or slot) sized and configured to allow for the insertion or removal of a fluid sensor 1720 therein. As noted space 1715 is disposed between upper portion 1706 and threaded portion 1707 of plug 1710 when the plug portions are coupled together. In one embodiment, fluid sensor 1720 may comprise a proximity sensor such as described above.

Threaded portion 1707 includes threads 1711 sized and configured to threadably engage a threaded opening or a threaded insert affixed to an opening within a wall of a fluid system, such as a wall of a coolant reservoir or manifold, as described above. Threaded portion 1707 further includes a cylindrical opening 1717 to a fluid sense window 1716 of threaded portion 1707. In operation, threaded portion 1707 may be coupled to the opening in the wall of a fluid system in a fluid-tight manner, and upper portion 1706 may be attached or removed from the threaded portion 1707 without removing threaded portion 1707 from the wall. The fluid-sensor-receiving space 1715 is sized and configured to position the fluid sensor substantially parallel to fluid sense window 1716 such that the fluid sensor at least partially overlies a portion of the opening in the wall. In one implementation, the plug 1710 is fabricated of a non-conductive material, and the wall or fluid system containing the fluid to be sensed may be fabricated of a conductive material, while still allowing the fluid sensor 1720 to comprise a proximity sensor, and to be removable from the plug without breaking the fluid-tight seal between the plug and the wall.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   a proximity sensor;
   a plug configured to couple to a wall of a fluid system within an opening in the wall to seal the opening, without contacting an inner surface of the wall of the fluid system, the plug being hollow and including a fluid sense window which projects through the wall into the fluid system substantially transverse to the opening in the wall when the plug is coupled to the wall within the opening; and
   wherein the plug comprises a fluid-sensor-receiving space continuously extending within the plug from one side of the wall, through the opening in the wall and into the fluid sense window within the fluid system on another side of the wall, the fluid-sensor-receiving opening being open at the one side of the wall, and the fluid-sensor-receiving space being configured to at least partially receive therein the proximity sensor and, when the plug is coupled to the wall and seals the opening, with the proximity sensor within the fluid-sensor-receiving space of the fluid sense window, the proximity sensor extends within the plug from the one side of the wall, through the wall into the fluid sense window within the fluid system on the another side of the wall to sense across the fluid sense window presence of fluid within the fluid system by emitting an electric field through the fluid sense window into the fluid system, and sensing a disruption in the electric field due to the presence of the fluid within the fluid system, the fluid sense window comprising a non-conductive material which allows the electric field to pass therethrough, and wherein the proximity sensor is removable from the fluid-sensor-receiving space of the fluid sense window without requiring uncoupling of the plug from the wall or unsealing of the opening in the wall.

2. The apparatus of claim 1, wherein the plug threadably seals to the wall within the opening therein.

3. The apparatus of claim 2, further comprising a threaded insert affixed to the wall at the opening, wherein the plug threadably seals to the wall by threadably engaging the threaded insert, and wherein the threaded insert comprises a conductive material.

4. A system comprising:
a coolant-based cooling apparatus to facilitate removal of heat generated by one or more electronic components, the coolant-based cooling apparatus comprising a coolant loop containing coolant of the coolant-based cooling apparatus; and
a fluid sense apparatus facilitating sensing of coolant within the coolant loop, the fluid sense apparatus comprising:
a proximity sensor;
a plug coupled to a wall of the coolant loop within an opening in the wall and sealing the opening, without contacting an inner surface of the wall of the coolant loop, the plug being hollow and including a fluid sense window which projects through the wall into the coolant loop substantially transverse to the opening in the wall; and
wherein the plug comprises a fluid-sensor-receiving space continuously extending within the plug from one side of the wall, through the opening in the wall and into the fluid sense window within the coolant loop on another side of the wall, the fluid-sensor-receiving space being open at the one side of the wall, and the fluid-sensor-receiving space being configured to at least partially receive therein the proximity sensor and to position the proximity sensor within the coolant loop to sense presence of coolant within the coolant loop by emitting an electric field through the fluid sense window into the coolant loop, and sensing disruption in the electric field due to the presence of the coolant within the coolant loop, the fluid sense window comprising a non-conductive material which allows the electric field to pass therethrough, and wherein the proximity sensor extends within the plug from the one side of the wall, through the wall, and into the fluid sense window on the another side of the wall, and is removable from the fluid-sensor-receiving space of the fluid sense window without requiring uncoupling of the plug from the wall of the coolant loop or unsealing of the opening in the wall.

5. The system of claim 4, wherein the coolant loop comprises a coolant reservoir and the wall with the opening is a wall of the coolant reservoir of the coolant loop, and wherein the proximity sensor disposed within the fluid sense window senses for presence of coolant at the level of the opening in the wall of the coolant reservoir.

6. The system of claim 4, wherein the fluid sense window is a rectangular-shaped fluid sense window that extends into the coolant reservoir.

7. The system of claim 5, wherein the plug threadably seals to the wall at the opening therein, and wherein the coolant reservoir comprises a conductive material.

8. A method comprising:
obtaining a coolant-based cooling apparatus to facilitate removal of heat generated by one or more electronic components, the coolant-based cooling apparatus comprising a coolant loop containing coolant of the coolant-based cooling apparatus; and
providing a fluid sense apparatus facilitating sensing for coolant within the coolant loop, the fluid sense apparatus comprising:
a proximity sensor;
a plug coupled to a wall of the coolant loop within an opening in the wall and sealing the opening, without contacting an inner surface of the wall of the coolant loop, the plug being hollow and including a fluid sense window which projects through the wall into the coolant loop substantially transverse to the opening in the wall; and
wherein the plug comprises a fluid-sensor-receiving space continuously extending within the plug from one side of the wall, through the opening in the wall and into the fluid sense window within the coolant loop on another side of the wall, the fluid-sensor-receiving opening being open at the one side of the wall, and the fluid-sensor-receiving space being configured to at least partially receive therein the proximity sensor and to position the proximity sensor within the coolant loop to sense presence of coolant within the coolant loop by emitting an electric field through the fluid sense window into the coolant loop, and sensing disruption in the electric field due to the presence of the coolant within the coolant loop, the fluid sense window comprising a non-conductive material which allows the electric field to pass therethrough, and wherein the proximity sensor extends within the plug from the one side of the wall, through the wall, and into the fluid sense window on the another side of the wall, and is removable from the fluid-sensor-receiving space of the fluid sense window without requiring uncoupling of the plug from the wall of the coolant loop or unsealing of the opening in the wall.

9. The method of claim 8, wherein the obtaining comprises obtaining the coolant loop with a coolant reservoir, the opening being in a wall of the coolant reservoir of the coolant loop, and wherein the proximity sensor is disposed within the fluid sense window to sense for presence of coolant at the level of the opening in the wall of the coolant reservoir.

10. The apparatus of claim 1, wherein the proximity sensor is a planar-shaped proximity sensor, the planar-shaped proximity sensor comprising a planar electrode which resides within the fluid-sensor-receiving space of the fluid sense window when the proximity sensor is operatively disposed within the plug.

11. The apparatus of claim 10, wherein the proximity sensor further comprises a coil electrode, the coil electrode encircling, at least in part, the planar electrode.

12. The apparatus of claim 1, wherein the fluid sense window of the plug comprises a tongue-shaped fluid sense window which extends into the fluid system when the plug is coupled to the wall and seals the opening.

* * * * *